United States Patent [19]

Doi et al.

[11] Patent Number: 5,759,709
[45] Date of Patent: Jun. 2, 1998

[54] POLYMERIC FLUORESCENT SUBSTANCE AND ORGANIC ELECTROLUMINESCENCE DEVICE

[75] Inventors: Shuji Doi; Takanobu Noguchi; Toshihiro Ohnishi; Masamitsu Ishitobi. all of Tsukuba. Japan

[73] Assignee: Sumitomo Chemical Company, Limited. Osaka. Japan

[21] Appl. No.: 397,489

[22] Filed: Mar. 2, 1995

[30] Foreign Application Priority Data

Mar. 10, 1994 [JP] Japan ................................. 6-040016
Apr. 11, 1994 [JP] Japan ................................. 6-072209
Jul. 29, 1994 [JP] Japan ................................. 6-177956

[51] Int. Cl.⁶ ......................................... H05B 33/14
[52] U.S. Cl. ........................ 428/690; 428/411.1; 428/457; 428/917; 313/504; 313/506
[58] Field of Search ........................... 428/411.1, 457, 428/690, 917; 313/504, 506

[56] References Cited

U.S. PATENT DOCUMENTS 5,102,973  4/1992  Iimura et al. ............................. 528/176

FOREIGN PATENT DOCUMENTS 0557534  9/1993  European Pat. Off. .

*Primary Examiner*—Marie Yamnitzky
*Attorney, Agent, or Firm*—Sughrue. Mion. Zinn. Macpeak & Seas, PLLC

[57] ABSTRACT

An organic electroluminescence device having at least a light emitting layer between the electrodes consisting of one pair of an anode and a cathode, at least one of which electrodes is transparent or semi-transparent, wherein said light emitting layer comprises a polymeric fluorescent substance which emits a fluorescence in a solid state, is soluble in solvents and comprises at least one kind of repeating unit represented by the following formula (1) and at least one kind of repeating unit represented by the following formula (2) with the number of the formula (1) repeating units being 2–50% of the total number of all the repeating units:

$$-Ar_1- \quad (1)$$

$$-Ar_2- \quad (2)$$

wherein $Ar_1$ and $Ar_2$ are each a bifunctional group forming a carbon—carbon bond with each of two adjacent groups, in the chemical structure of $Ar_1$, the number of the consecutive atoms present in the shortest path between the two carbon atoms bonding to said two adjacent groups is 1, 3 or 5, and in the chemical structure of $Ar_2$, the total number of the carbon and nitrogen atoms present in the shortest path between the two carbon atoms bonding to said two adjacent groups is an even number, and a novel polymeric fluorescent substance used in the above device.

8 Claims, No Drawings

POLYMERIC FLUORESCENT SUBSTANCE AND ORGANIC ELECTROLUMINESCENCE DEVICE

BACKGROUND OF THE INVENTION

1. Field of the Invention

The present invention relates to organic electroluminescence devices (which may hereinafter be referred to as organic EL devices) and polymeric fluorescent substances used therein. More particularly, the present invention relates to organic EL devices with high luminous efficiency and polymeric fluorescent substances used therein, having a strong fluorescence and being soluble in solvents.

2. Description of the Related Art

Inorganic electroluminescence devices (which may hereinafter be referred to as inorganic EL devices) using an inorganic fluorescent substance as the light emitting material have been applied to various uses, for example, as a flat light source for backlight of liquid crystal displays and various display devices such as flat panel display and the like. In these devices, however, a high-voltage alternating current has been required for driving the devices.

Recently, Tang et al. manufactured an organic EL device having a double-layer structure comprising a laminate of a light emitting layer made of an organic fluorescent dye and a layer of an organic charge transport compound generally used, for example, in a photosensitive layer for electrophotography to realize a low-voltage-drive, high-efficiency and high-luminance organic EL device (JP-A-59-194393). In view of many advantageous features of organic EL devices as compared with inorganic EL devices, such as low-voltage drive, high luminance and easy luminescence of a large number of colors, various attempts have been made and reported regarding the development and improvement of the device structure, organic fluorescent dye and organic charge transport compound used in organic EL devices [Jpn. J. Appl. Phys., Vol. 27, L269 (1988); J. Appl. Phys., Vol. 65, p. 3610 (1989)].

Hitherto, low-molecular weight organic fluorescent dyes have generally been used as a material of the light emitting layer and, regarding polymeric light emitting materials, proposals have been made in some patents and publications such as WO9013148, JP-A-3-244630 and Appl. Phys. Lett., Vol. 58, p. 1982 (1991). WO9013148 discloses in the Examples an EL device using a thin film of poly(p-phenylene vinylene) obtained by forming a film of a soluble precursor on the electrode and subjecting it to a heat treatment to convert the precursor into a conjugated polymer.

JP-A-3-244630 illustrates conjugated polymers having a salient feature that they are themselves soluble in solvents and make heat treatment unnecessary. In Appl. Phys. Lett., Vol. 58, 1982 (1991) are also disclosed polymeric light emitting materials soluble in solvents and organic EL devices made by using such materials. Most of the organic EL devices manufactured by using these materials, however, were not sufficiently high in luminous efficiency.

An attempt to increase the quantum yield of fluorescence of polymeric light emitting material is already reported in Nature, Vol. 356, p. 47 (1992). In the literature, it is described that by, in the course of forming a conjugated segment from a soluble precursor copolymer by heat treating, allowing the non-conjugated segment of the copolymer to remain unchanged, there can be obtained a polymer having both a conjugated segment and a non-conjugated segment and emitting a strong fluorescence. Here, since the 2,5-dimethoxy-p-phenylene-methoxyethylene moiety in the copolymer is hard to decompose by heat treatment alone, it is utilized for inhibiting the copolymer from being converted in its entirety into a conjugated polymer by the heat treatment.

It is further reported that a polymer in which a conjugated monomeric moiety with strong fluorescence and an aliphatic hydrocarbon are coupled via an ether linkage, generates a blue fluorescence because of its short conjugated chain length, and a blue light-emitting organic EL device can be made by using said polymer [Macromolecules, Vol. 26, p. 1188 (1993)].

It is also reported that an alternating copolymer composed of unsubstituted p-phenylene vinylene and unsubstituted m-phenylene vinylene has a greenish blue fluorescence [Vysokomolekul. Soedin., Vol. 5, p. 805 (1963)]. However, the quantum yield of fluorescence and EL properties of said copolymer are unknown.

With respect to the luminous efficiency of organic EL device, it is reported that since a poly-p-phenylene vinylene derivative (in which a cyano group is introduced into the vinylene group of p-phenylene vinylene) having a red fluorescence has high electron affinity and enables easy electron injection thereinto, said derivative allows for the production of an organic EL device which is high in luminous efficiency, i.e. the proportion of photons released per one electron injected [Nature, Vol. 365, p. 628 (1993)].

However, in the manufacture of organic EL devices using polymers reported hitherto, it has been necessary to mold a soluble precursor into a thin film and convert its structure into a conjugated polymeric structure by high-temperature heat treatment, so that there have been restrictions on the materials used for the associated parts such as substrate and the like in said manufacture. Also, when a precursor polymer is converted into a conjugated polymer by heat treatment, control of the non-conjugated moiety in the latter polymer has been made by adjusting the heat treatment conditions, so that such control has not been perfect and, when the conjugated polymer was used for an organic EL device, the device had, in long-time continuous drive, a fear of change in the structure owing to the heat generation of the device or other factors.

When there is used a polymer in which a conjugated monomeric moiety is coupled with a non-conjugated aliphatic hydrocarbon via an ether linkage, the polymer has a short conjugated chain (the length of conjugated chain is thought to contribute to transport of charge) and thereby the transfer of charge in the polymer is feared to be difficult.

In the case of soluble conjugated polymers, although no high-temperature heat treatment is necessary after formation of the resin film, further improvements are required on the quantum yield of fluorescence as well as on the luminous efficiency of the EL devices using said polymers.

As to the hitherto known poly-p-phenylene vinylene derivatives in which a cyano group is introduced into the vinylene group of the p-phenylene vinylene, no detail is disclosed on the quantum yield of fluorescence of said polymers.

Thus, there have been desired a polymeric fluorescent substance which has excellent solvent solubility, high quantum yield of fluorescence and excellent electrical conductivity; and an organic EL device of high luminance which can easily be produced using said polymeric fluorescent substance by coating.

The objects of the present invention are to provide a polymeric fluorescent substance having high quantum yield of fluorescence, excellent solvent solubility and excellent charge transport; and an organic EL device of high luminance and high luminous efficiency which can easily be produced using said polymeric fluorescent substance by coating.

SUMMARY OF THE INVENTION

In view of the above situation, the present inventors made a study on the improvement of the luminous efficiency of the organic EL device using a polymeric fluorescent substance for the light emitting layer. As a result, the present inventors found out that a polymeric fluorescent substance containing, in the main chain, repeating units of particular structure each having conjugated bond(s) has a high quantum yield of fluorescence and that an organic EL device of high luminous efficiency can easily be produced using said polymeric fluorescent substance by coating. The finding has led to the completion of the present invention.

The present invention includes the followings.

(1) An organic electroluminescence device having at least a light emitting layer between the electrodes consisting of one pair of an anode and a cathode, at least one of which electrodes is transparent or semi-transparent, wherein said light emitting layer comprises a polymeric fluorescent substance which emits a fluorescence in a solid state, is soluble in solvents and comprises at least one kind of repeating unit represented by the following formula (1) and at least one kind of repeating unit represented by the following formula (2) with the number of the formula (1) repeating units being 2–50% of the total number of all the repeating units:

(1)

wherein $Ar_1$ is a bifunctional group forming a carbon—carbon bond with each of two adjacent groups and is selected from the group consisting of an aromatic compound group having 6–22 carbon atoms taking part in the conjugated bonds, an at least 6-membered heterocyclic aromatic compound group having at least one hetero atom and 4–20 carbon atoms, and a group composed of said aromatic compound group or said heterocyclic aromatic compound group and a vinylene group; in the chemical structure of $Ar_1$, the number of the consecutive atoms present in the shortest path between the two carbon atoms bonding to said two adjacent groups is 1, 3 or 5, and

(2)

wherein $Ar_2$ is a bifunctional group forming a carbon—carbon bond with each of two adjacent groups and is selected from the group consisting of an aromatic compound group having 6–22 carbon atoms taking part in the conjugated bonds, an at least 5-membered heterocyclic aromatic compound group having at least one hetero atom and 4–20 carbon atoms, and a group composed of said aromatic compound group or said heterocyclic aromatic compound group and a vinylene group; in the chemical structure of $Ar_2$, the total number of the carbon and nitrogen atoms present in the shortest path between the two carbon atoms bonding to said two adjacent groups is an even number.

(2) An organic electroluminescence device according to (1), wherein the repeating unit of formula (1) and the repeating unit of formula (2), both of the solvent-soluble polymeric fluorescent substance are a repeating unit of the following formula (3) and a repeating unit of the following formula (4), respectively:

(3)

(4)

wherein $Ar_3$ is a bifunctional group forming a carbon—carbon bond with each of two adjacent vinylene groups and is selected from the group consisting of an aromatic compound group having 6–20 carbon atoms taking part in the conjugated bonds and an at least 6-membered heterocyclic aromatic compound group having at least one hetero atom and 4–18 carbon atoms; in the chemical structure of $Ar_3$, the number of the consecutive atoms present in the shortest path between the two carbon atoms bonding to said two adjacent vinylene groups is 1, 3 or 5; $Ar_4$ is a bifunctional group forming a carbon—carbon bond with each of two adjacent vinylene groups and is selected from the group consisting of an aromatic compound group having 6–20 carbon atoms taking part in the conjugated bonds and an at least 5-membered heterocyclic aromatic compound group having at least one hetero atom and 4–18 carbon atoms; in the chemical structure of $Ar_4$, the total number of the carbon and nitrogen atoms present in the shortest path between the two carbon atoms bonding to said two adjacent vinylene groups is an even number; and $R_1$, $R_2$, $R_3$ and $R_4$ are independently is a group selected from the group consisting of a hydrogen atom, a cyano group, an alkyl group of 1–20 carbon atoms and an aryl group of 6–18 carbon atoms.

(3) An organic electroluminescence device according to (1) or (2), wherein the repeating unit of formula (1) or the $Ar_3$ portion of formula (3) is selected from repeating units each containing at least one of the structures represented by the following formula (5):

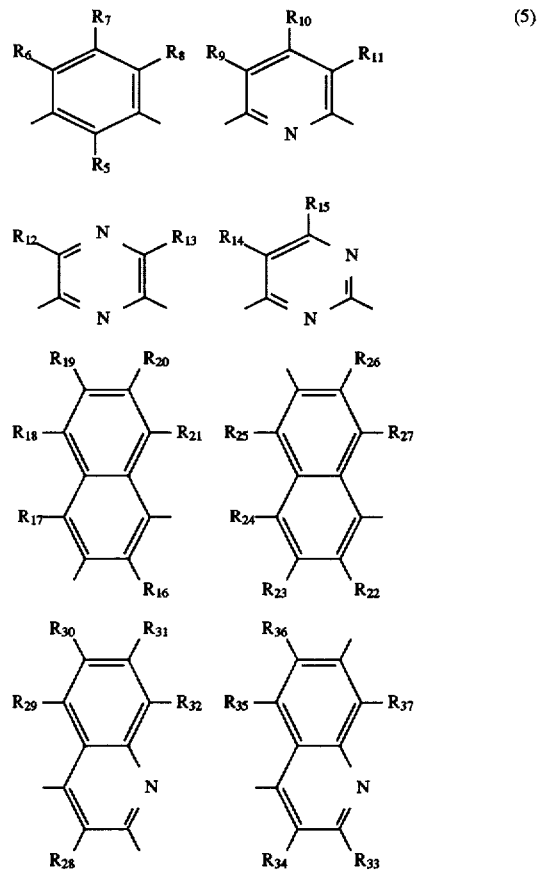

(5)

wherein $R_5$ to $R_{37}$ are independently a group selected from the group consisting of a hydrogen atom, a cyano group, an alkyl, alkoxy or alkylthio group of 1–20 carbon atoms, an aryl or aryloxy group of 6–18 carbon atoms and a heterocyclic compound group of 4–14 carbon atoms.

(4) An organic electroluminescence device according to (1), (2) or (3), wherein the polymeric fluorescent substance is a copolymer comprising repeating units represented by the following formulas (6) and (7):

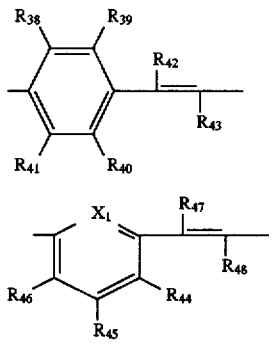

wherein $X_1$ is a group selected from the group consisting of C—$R_{49}$ and N; $R_{38}$ to $R_{41}$, $R_{44}$ to $R_{46}$ and $R_{49}$ are independently a group selected from the group consisting of a hydrogen atom, a cyano group, an alkyl, alkoxyl or alkylthio group of 1–20 carbon atoms, an aryl or aryloxy group of 6–18 carbon atoms and a heterocyclic aromatic compound group of 4–14 carbon atoms; and $R_{42}$, $R_{43}$, $R_{47}$ and $R_{48}$ are independently a group selected from the group consisting of a hydrogen atom, a cyano group, an alkyl group of 1–20 carbon atoms and an aryl group of 6–18 carbon atoms.

(5) An organic electroluminescence device according to (1), (2), (3) or (4), wherein the polymeric fluorescent substance is a polymeric fluorescent substance comprising at least one repeating unit selected from the repeating units represented by the following formula (8):

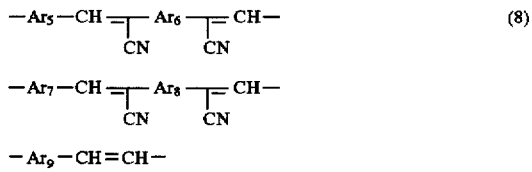

wherein $Ar_5$, $Ar_8$ and $Ar_9$ are each a bifunctional group forming a carbon—carbon bond with each of two adjacent vinylene groups and is selected from the group consisting of an aromatic compound group having 6–20 carbon atoms taking part in the conjugated bonds and an at least 5-membered heterocyclic aromatic compound group having at least one hetero atom and 4–18 carbon atoms; in the chemical structure of each of $Ar_5$, $Ar_8$ and $Ar_9$, the total number of the consecutive carbon and nitrogen atoms present in the shortest path between the two carbon atoms bonding to said two adjacent vinylene groups is an even number; $Ar_6$ and $Ar_7$ are each a bifunctional group forming a carbon—carbon bond with each of two adjacent vinylene groups and is selected from the group consisting of an aromatic compound group having 6–20 carbon atoms taking part in the conjugated bonds and an at least 6-membered heterocyclic aromatic compound group having at least one hetero atom and 4–18 carbon atoms; in the chemical structure of each of $Ar_6$ and $Ar_7$, the number of the consecutive atoms present in the shortest path between the two carbon atoms bonding to said two adjacent vinylene groups is 1, 3 or 5.

(6) An organic electroluminescence device according to (1), (2), (3), (4) or (5), wherein a layer comprising an electron transport compound is provided between the cathode and the light emitting layer in adjacency to the light emitting layer.

(7) An organic electroluminescence device according to (1), (2), (3), (4) or (5), wherein a layer comprising a hole transport compound is provided between the anode and the light emitting layer in adjacency to the light emitting layer.

(8) An organic electroluminescence device according to (1), (2), (3), (4) or (5), wherein a layer comprising an electron transport compound is provided between the cathode and the light emitting layer in adjacency to the light emitting layer and a layer comprising a hole transport compound is provided between the anode and the light emitting layer in adjacency to the light emitting layer.

(9) A polymeric fluorescent substance which is soluble in solvents, emits a fluorescence in a solid state, has a polystyrene-reduced number-average molecular weight of $10^3$–$10^7$ and comprises a repeating unit of the following formula (9) and a repeating units of the following formula (10), respectively:

 (9)

 (10)

wherein $Ar_{10}$ is a bifunctional group forming a carbon—carbon bond with each of two adjacent vinylene groups and is selected from the group consisting of an aromatic compound group having 6–20 carbon atoms taking part in the conjugated bonds and an at least 6-membered heterocyclic aromatic compound group having at least one hetero atom and 4–18 carbon atoms; in the chemical structure of $Ar_{10}$, the number of the consecutive atoms present in the shortest path between the two carbon atoms bonding to said two adjacent vinylene groups is 1, 3 or 5; $Ar_{11}$ is a bifunctional group forming a carbon—carbon bond with each of two adjacent vinylene groups and is selected from an aromatic compound group having 6–20 carbon atoms taking part in the conjugated bonds and an at least 5-membered heterocyclic aromatic compound group having at least one hetero atom and 4–18 carbon atoms; in the chemical structure of $Ar_{11}$, the total number of the consecutive carbon and nitrogen atoms present in the shortest path between the two carbon atoms bonding to said two adjacent vinylene groups is an even number; and $R_1$, $R_2$, $R_3$ and $R_4$ are independently is a group selected from the group consisting of a hydrogen atom, a cyano group, an alkyl group of 1–20 carbon atoms and an aryl group of 6–18 carbon atoms; and at least one of $Ar_{10}$ and $Ar_{11}$, is substituted by at least one of the group selected from the group consisting of an alkyl, alkoxyl or alkylthio group of 4–20 carbon atoms, an aryl or aryloxy group of 6–18 carbon atoms and a heterocyclic aromatic compound group of 4–14 carbon atoms.

(10) A polymeric fluorescent substance according to (9), wherein the $Ar_{10}$ portion of formula (9) is selected from repeating units each containing at least one of the structures represented by the following formula (5):

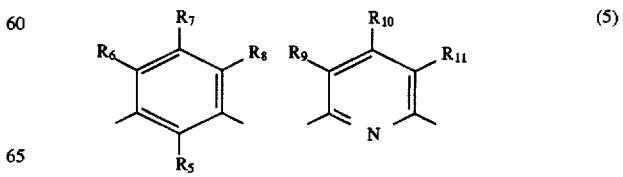 (5)

-continued

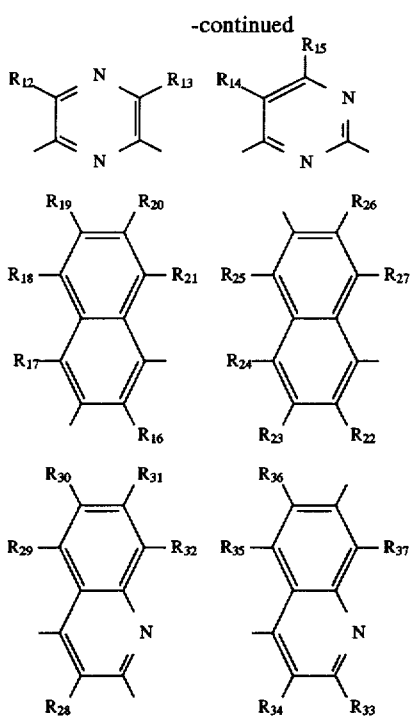

wherein $R_5$ to $R_{37}$ are independently a group selected from the group consisting of a hydrogen atom, a cyano group, an alkyl, alkoxyl or alkylthio group of 1–20 carbon atoms, an aryl or aryloxy group of 6–18 carbon atoms and a heterocyclic aromatic compound group of 4–14 carbon atoms.

(11) A polymeric fluorescent substance according to (9) or (10), which is a copolymer comprising a repeating unit represented by the following formula (11) and a repeating unit represented by the following formula (12) with the molar ratio of the formula (11) repeating unit and the formula (12) repeating unit being 5:1 to 1:20:

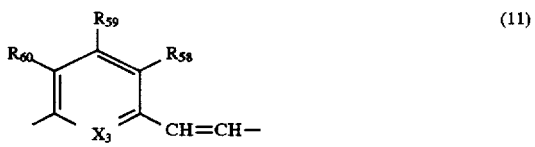 (11)

wherein $X_3$ is a group selected from the group consisting of

and =N—; and $R_{58}$ to $R_{61}$ are independently a group selected from the group consisting of a hydrogen atom, an alkyl, alkoxyl or alkylthio group of 1–20 carbon atoms, an aryl or aryloxy group of 6–18 carbon atoms and a heterocyclic aromatic compound group of 4–14 carbon atoms, and

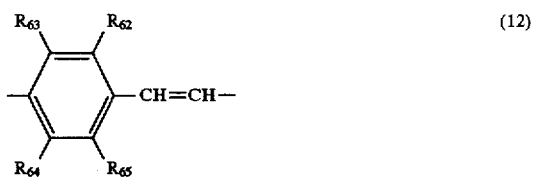 (12)

wherein $R_{62}$ to $R_{65}$ are independently a group selected from the group consisting of a hydrogen atom, an alkyl, alkoxyl or alkylthio group of 1–20 carbon atoms, an aryl or aryloxy group of 6–18 carbon atoms and a heterocyclic aromatic compound group of 4–14 carbon atoms; and at least one of $R_{62}$ to $R_{65}$ is a group selected from the group consisting of an alkyl, alkoxyl or alkylthio group of 4–20 carbon atoms, an aryl or aryloxy group of 6–18 carbon atoms and a heterocyclic aromatic compound group of 4–14 carbon atoms.

(12) A polymeric fluorescent substance according to (9) or (10), which is a copolymer further containing, in addition to the formula (11) repeating unit and the formula (12) repeating unit, a repeating unit represented by the following formula (13) with the molar ratio of the formula (11) repeating unit and the total of the repeating units of formulae (12) and (13) being 5:1 to 1:20 and the amount of the formula (12) repeating unit being at least 10 mole % based on the total repeating units:

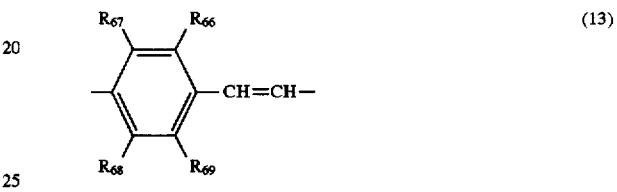 (13)

wherein $R_{66}$ to $R_{69}$ are independently a group selected from the group consisting of a hydrogen atom and an alkyl, alkoxyl or alkylthio group of 1–3 carbon atoms.

(13) A polymeric fluorescent substance which is soluble in solvents, emits a fluorescence in a solid state, has a polystyrene-reduced number-average molecular weight of $10^3$–$10^7$ and comprises a repeating unit represented by the following formula (14):

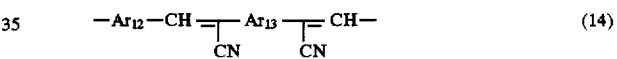 (14)

wherein $Ar_{12}$ is a bifunctional group forming a carbon—carbon bond with each of two adjacent vinylene groups and is selected from the group consisting of an aromatic compound group having 6–20 carbon atoms taking part in the conjugated bonds and an at least 5-membered heterocyclic aromatic compound group having at least one hetero atom and 4–18 carbon atoms; in the chemical structure of $Ar_{12}$, the total number of the carbon and nitrogen atoms present in the shortest path between the two carbon atoms bonding to said two adjacent vinylene groups is an even number; $Ar_{13}$ is a bifunctional group forming a carbon—carbon bond with each of two adjacent vinylene groups and is selected from the group consisting of an aromatic compound group having 6–20 carbon atoms taking part in the conjugated bonds and an at least 6-membered heterocyclic aromatic compound group having at least one hetero atom and 4–18 carbon atoms; in the chemical structure of $Ar_{13}$, the number of the consecutive atoms present in the shortest path between the two carbon atoms bonding to said two adjacent vinylene groups is 1, 3 or 5.

(14) A polymeric fluorescent substance which is soluble in solvents, emits a fluorescence in a solid state, has a polystyrene-reduced number-average molecular weight of $10^3$–$10^7$ and comprises a repeating unit represented by the following formula (15):

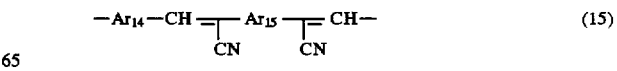 (15)

wherein $Ar_{14}$ is a bifunctional group forming a carbon—carbon bond with each of two adjacent vinylene groups and is selected from the group consisting of an aromatic compound group having 6–20 carbon atoms taking part in the conjugated bonds and an at least 6-membered heterocyclic aromatic compound group having at least one hetero atom and 4–18 carbon atoms; in the chemical structure of $Ar_{14}$, the total number of the consecutive atoms present in the shortest path between the two carbon atoms bonding to said two adjacent vinylene groups is 1, 3 or 5; $Ar_{15}$ is a bifunctional group forming a carbon—carbon bond with each of two adjacent vinylene groups and is selected from the group consisting of an aromatic compound group having 6–20 carbon atoms taking part in the conjugated bonds and an at least 5-membered heterocyclic aromatic compound group having at least one hetero atom and 4–18 carbon atoms; in the chemical structure of $Ar_{15}$, the total number of the carbon and nitrogen atoms present in the shortest path between the two carbon atoms bonding to said two adjacent vinylene groups is an even number.

(15) A polymeric fluorescent substance which is soluble in solvents, emits a fluorescence in a solid state, has a polystyrene-reduced number-average molecular weight of $10^3$–$10^7$ and is a copolymer comprising a repeating unit represented by the following formula (14) and a repeating unit represented by the following formula (16) with the total amount of the formula (14) repeating unit being at least 5 mole % of the total repeating units:

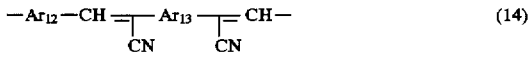  (14)

wherein $Ar_{12}$ is a bifunctional group forming a carbon—carbon bond with each of two adjacent vinylene groups and is selected from the group consisting of an aromatic compound group having 6–20 carbon atoms taking part in the conjugated bonds and an at least 5-membered heterocyclic aromatic compound group having at least one hetero atom and 4–18 carbon atoms; in the chemical structure of $Ar_{12}$, the total number of the carbon and nitrogen atoms present in the shortest path between the two carbon atoms bonding to said two adjacent vinylene groups is an even number; $Ar^{13}$ is a bifunctional group forming a carbon—carbon bond with each of two adjacent vinylene groups and is selected from the group consisting of an aromatic compound group having 6–20 carbon atoms taking part in the conjugated bonds and an at least 6-membered heterocyclic aromatic compound group having at least one hetero atom and 4–18 carbon atoms; in the chemical structure of $Ar_{13}$, the number of the consecutive atoms present in the shortest path between the two carbon atoms bonding to said two adjacent vinylene groups is 1, 3 or 5, and —$Ar_{16}$—CH=CH—  (16)

wherein $Ar_{16}$ is a bifunctional group forming a carbon—carbon bond with each of two adjacent substituted or unsubstituted vinylene groups and is selected from the group consisting of an aromatic compound group having 6–22 carbon atoms taking part in the conjugated bonds and an at least 5-membered heterocyclic aromatic compound group having at least one hetero atom and 4–20 carbon atoms; in the chemical structure of $Ar_{16}$, the total number of the carbon and nitrogen atoms present in the shortest path between the two carbon atoms bonding to said two adjacent vinylene groups is an even numbers.

(16) A polymeric fluorescent substance which is soluble in solvents, emits a fluorescence in a solid state, has a polystyrene-reduced number-average molecular weight of $10^3$–$10^7$ and is a copolymer comprising a repeating unit represented by the following formula (15) and a repeating unit represented by the following formula (16) with the amount of the formula (15) repeating unit being at least 5 mole % of the total repeating units:

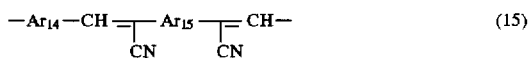  (15)

wherein $Ar_{14}$ is a bifunctional group forming a carbon—carbon bond with each of two adjacent vinylene groups and is selected from the group consisting of an aromatic compound group having 6–20 carbon atoms taking part in the conjugated bonds and an at least 6-membered heterocyclic aromatic compound group having at least one hetero atom and 4–18 carbon atoms; in the chemical structure of $Ar_{14}$, the total number of the consecutive atoms present in the shortest path between the two carbon atoms bonding to said two adjacent vinylene groups is 1, 3 or 5; $Ar_{15}$ is a bifunctional group forming a carbon—carbon bond with each of two adjacent vinylene groups and is selected from the group consisting of an aromatic compound group having 6–20 carbon atoms taking part in the conjugated bonds and an at least 5-membered heterocyclic aromatic compound group having at least one hetero atom and 4–18 carbon atoms; in the chemical structure of $Ar_{15}$, the total number of the carbon and nitrogen atoms present in the shortest path between the two carbon atoms bonding to said two adjacent vinylene groups is an even number, and

  (16)

wherein $Ar_{16}$ is a bifunctional group forming a carbon—carbon bond with each of two adjacent vinylene groups and is selected from the group consisting of an aromatic compound group having 6–22 carbon atoms taking part in the conjugated bonds and an at least 5-membered heterocyclic aromatic compound group having at least one hetero atom and 4–20 carbon atoms; in the chemical structure of $Ar_{16}$, the total number of the carbon and nitrogen atoms present in the shortest path between the two carbon atoms bonding to said two adjacent vinylene groups is an even number.

(17) A polymeric fluorescent substance according to any one of (13), (14), (15) and (16), wherein the $Ar_{13}$ portion of formula (14)

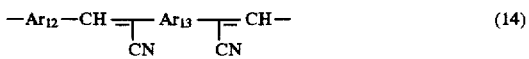  (14)

or the $Ar_{14}$ portion of formula (15)

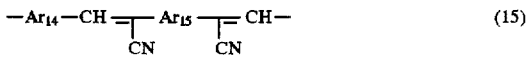  (15)

is selected from repeating units each containing one of the structures represented by the following formula (5):

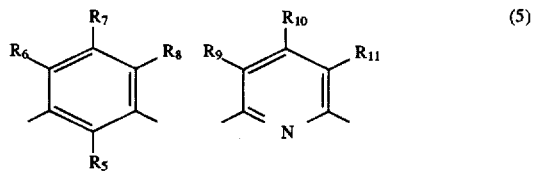  (5)

-continued

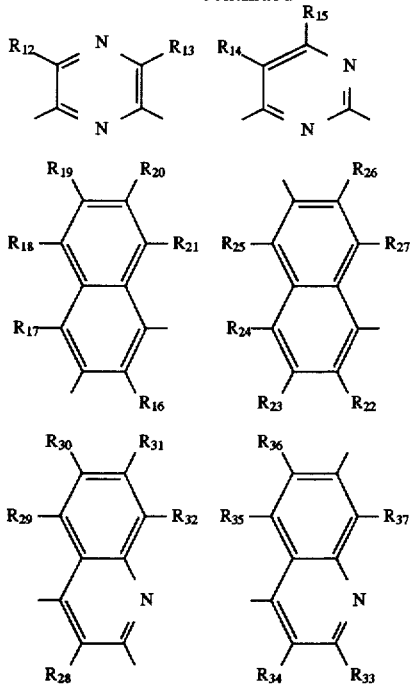

wherein $R_5$ to $R_{37}$ are independently a group selected from the group consisting of a hydrogen atom, a cyano group, an alkyl, alkoxyl or alkylthio group of 1–20 carbon atoms, an aryl or aryloxy group of 6–18 carbon atoms and a heterocyclic aromatic compound group of 4–14 carbon atoms.

(18) A polymeric fluorescent substance according to any one of (13), (14), (15), (16) and (17), wherein the $Ar_{12}$ portion of formula (14)

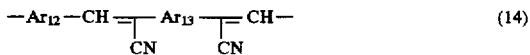 (14)

or the $Ar_{15}$ portion of formula (10)

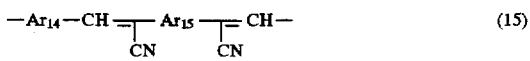 (15)

or the $Ar_{16}$ portion of formula (16)

 (16)

comprises a repeating unit represented by the following formula (17) and the $Ar_{13}$ portion of formula (14) or the $Ar_{14}$ portion of formula (15) comprises a repeating unit represented by the following formula (18):

(17)

(18)

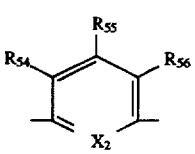

wherein $X_2$ is a group selected from the group consisting of C—$R_{57}$ and N; and $R_{50}$ to $R_{57}$ are independently a group selected from the group consisting of a hydrogen atom, a cyano group, an alkyl, alkoxyl or alkylthio group of 1–20 carbon atoms, an aryl or aryloxy group of 6–18 carbon atoms and a heterocyclic aromatic compound group of 4–14 carbon atoms.

(19) An organic electroluminescence device according to (1), wherein the polymeric fluorescent substance is a polymeric fluorescent substance according to any one of (9) to (18).

PREFERRED EMBODIMENTS OF THE INVENTION

The organic EL devices of the present invention and the polymeric fluorescent substances used therein are hereinafter described in detail.

The polymeric fluorescent substances used in the organic EL devices of the present invention, each contain at least one kind of repeating unit represented by formula (1) and at least one kind of repeating unit represented by formula (2) with the number of the formula (1) repeating units being 2–50%, preferably 5–30% of the total number of all the repeating units.

In the polymeric fluorescent substances, $Ar_1$ of formula (1) is a bifunctional group forming a carbon—carbon bond with each of two adjacent groups and is selected from the group consisting of an aromatic compound group having 6–22 carbon atoms taking part in the conjugated bonds, an at least 6-membered heterocyclic aromatic compound group having a hetero atom(s) and 4–20 carbon atoms, and a group composed of said aromatic compound group or said heterocyclic aromatic compound group and a vinylene group; and in the chemical structure of $Ar_1$, the number of the consecutive atoms present in the shortest path between the two carbon atoms bonding to said two adjacent groups is 1, 3 or 5.

Specific examples of $Ar_1$ are bivalent aromatic compound groups represented by formula (5), derivatives thereof, and arylene vinylene groups each composed of one of the above groups and a substituted or unsubstituted vinylene group represented by the following formula (19):

 (19)

wherein $R_{70}$ and $R_{71}$ are independently a group selected from the group consisting of a hydrogen atom, a cyano group, an alkyl group of 1–20 carbon atoms and an aryl group of 6–18 carbon atoms.

Of these, preferable are 1,3-phenylene group, naphthalene-1,3-diyl group, pyridine-2,6-diyl group, quinoline-2,4-diyl group, arylene vinylene groups each composed of one of the above groups and a vinylene group, and groups each formed by attaching substituent(s) to one of the above groups.

More preferable are 1,3-phenylene group, pyridine-2,6-diyl group, arylene vinylene groups each composed of one of the above groups and a vinylene group, and groups formed by attaching a substituent(s) to one of the above groups.

$Ar_2$ of formula (2) is a bifunctional group forming a carbon—carbon bond with each of two adjacent groups and is selected from the group consisting of an aromatic compound group having 6–22 carbon atoms taking part in the conjugated bonds, an at least 5-membered heterocyclic aromatic compound group having a hetero atom(s) and 4–20 carbon atoms, and a group composed of said aromatic compound group or said heterocyclic aromatic compound group and a vinylene group; and in the chemical structure of $Ar_2$, the total number of the carbon and nitrogen atoms present in the shortest path between the two carbon atoms bonding to said two adjacent groups is an even number.

Specific examples of $Ar_2$ are bivalent aromatic compound groups represented by the following formula (20), derivatives thereof, and arylene vinylene groups each composed of one of the above groups and a substituted or unsubstituted vinylene group represented by the above formula (19):

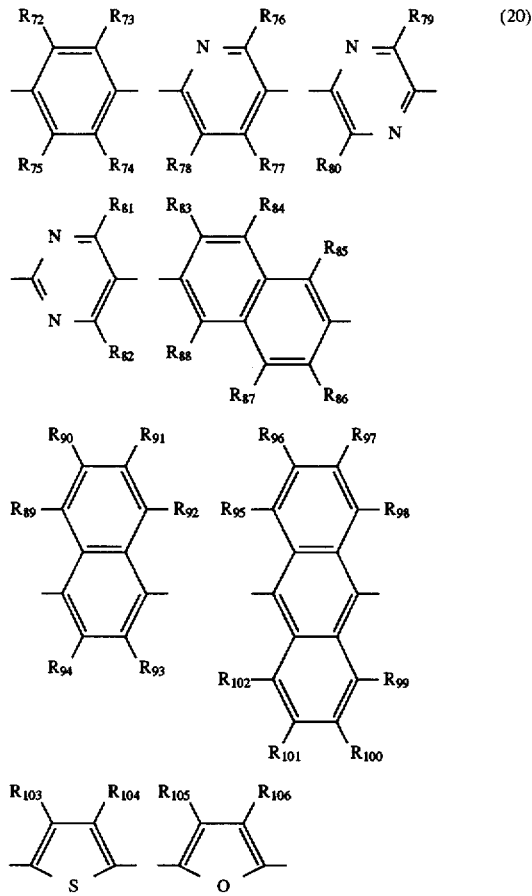

wherein $R_{72}$ to $R_{106}$ are independently a group selected from the group consisting of a hydrogen atom, a cyano group, an alkyl, alkoxyl or alkylthio group of 1–20 carbon atoms, an aryl or aryloxy group of 6–18 carbon atoms, and a heterocyclic aromatic compound group of 4–14 carbon atoms.

Of these, preferable are 1,4-phenylene group, naphthalene-2,6-diyl group, anthracene-9,10-diyl group, pyridine-2,5-diyl group, 2,5-thienylene group, arylene vinylene groups each composed of one of the above groups and a vinylene group, and groups each formed by attaching a substituent(s) to one of the above groups.

More preferable are 1,4-phenylene group, pyridine-2,5-diyl group, 2,5-thienylene group, arylene vinylene groups each composed of one of the above groups and a vinylene group, and groups each formed by attaching a substituent(s) to one of the above groups.

When the above repeating units are combined, larger repeating units are formed. For example, when a 1,4-phenylene group and a 1,4-phenylene vinylene group are combined, a 4,4'-biphenylene vinylene group is formed.

Mention is made on the substituent(s). The alkyl group of 1–20 carbon atoms includes methyl group, ethyl group, propyl group, butyl group, pentyl group, hexyl group, heptyl group, octyl group, decyl group, lauryl group, etc. Of these, preferable are methyl group, ethyl group, pentyl group, hexyl group, heptyl group and octyl group.

The alkoxyl group of 1–20 carbon atoms includes methoxyl group, ethoxyl group, propoxyl group, butoxyl group, pentyloxy group, hexyloxy group, heptyloxy group, octyloxy group, decyloxy group, lauryloxy group, etc. Of these, preferable are methoxyl group, ethoxyl group, pentyloxy group, hexyloxy group, heptyloxy group and octyloxy group.

The alkylthio group includes methylthio group, ethylthio group, propylthio group, butylthio group, pentylthio group, hexylthio group, heptylthio group, octylthio group, decylthio group, laurylthio group, etc. Of these, preferable are methylthio group, ethylthio group, pentylthio group, hexylthio group, heptylthio group and octylthio group.

The aryl group is exemplified by phenyl group, $4-C_1-C_{12}$ alkoxyphenyl groups ($C_1-C_{12}$ refers to 1–12 carbon atoms), $4-C_1-C_{12}$ alkylphenyl groups, 1-naphthyl group and 2-naphthyl group.

The aryloxy group is exemplified by phenoxy group.

The heterocyclic aromatic compound group is exemplified by 2-thienyl group, 2-pyrrolyl group, 2-furyl group and 2-, 3- or 4-pyridyl group.

Next, description is made on the polymeric fluorescent substances of the present invention.

The polymeric fluorescent substances of the present invention are soluble in solvents and have a number-average molecular weight of $10^3$–$10^7$. They include a polymeric fluorescent substance which is a copolymer containing a repeating unit of formula (9) and a repeating unit of formula (10); a polymeric fluorescent substance containing a repeating unit of formula (14) or a repeating unit of formula (15); a polymeric fluorescent substance which is a copolymer containing a repeating unit of formula (14) and a repeating unit of formula (16) with the amount of the formula (14) repeating unit being 5 mole % or more of the total repeating units; a polymeric fluorescent substance which is a copolymer containing a repeating unit of formula (15) and a repeating unit of formula (16) with the amount of the formula (15) repeating unit being 5 mole % or more of the total repeating units; a polymeric fluorescent substance which is a copolymer containing a repeating unit of formula (11) and a repeating unit of formula (12) with the molar ratio of the formula (11) repeating unit and the formula (12) repeating unit being 5:1 to 1:20; and a polymeric fluorescent substance which is a copolymer containing a repeating unit of formula (11), a repeating unit of formula (12) and a repeating unit of formula (13) with the molar ratio of the formula (11) repeating unit and the total of the formula (12) repeating unit and the formula (13) repeating unit being 5:1 to 1:20 and the amount of the formula (12) repeating unit being 10 mole % or more of the total repeating units.

Herein, the number-average molecular weight refers to a polystyrene-reduced number-average molecular weight measured by gel permeation chromatography (GPC) using chloroform as the solvent.

The polymeric fluorescent substance containing a repeating unit of formula (14) or formula (15), contains said repeating unit in an amount of preferably 10 mole % or more based on the total repeating units. In view of the solubility of the polymeric fluorescent substance in solvents, at least one of $Ar_{10}$, $Ar_{11}$ [these are contained in the formula (14) repeating unit], $Ar_{12}$, $Ar_{13}$ [these are contained in the formula (15) repeating unit] and $Ar_7$ (contained in the formula (16) repeating unit) preferably has at least one substituent selected from the group consisting of an alkyl, alkoxyl or alkylthio group of 4–20 carbon atoms, an aryl or aryloxy group of 6–18 carbon atoms and a heterocyclic aromatic compound group of 4–14 carbon atoms.

The substituent is exemplified by the following. The alkyl group of 4–20 carbon atoms includes butyl group, pentyl group, hexyl group, heptyl group, octyl group, decyl group, lauryl group, etc. Of these, pentyl group, hexyl group, heptyl group and octyl group are preferable.

The alkoxyl group of 4–20 carbon atoms includes butoxyl group, pentyloxy group, hexyloxy group, heptyloxy group, octyloxy group, decyloxy group, lauryloxy group, etc. Of these, pentyloxy group, hexyloxy group, heptyloxy group and octyloxy group are preferable.

The alkylthio group includes butylthio group, pentylthio group, hexylthio group, heptylthio group, octylthio group, decylthio group, laurylthio group, etc. Of these, pentylthio group, hexylthio group, heptylthio group and octylthio group are preferable.

The aryl group is exemplified by phenyl group, 4-$C_1$–$C_{12}$ alkoxyphenyl groups ($C_1$–$C_{12}$ refers to 1–12 carbon atoms), 4-$C_1$–$C_{12}$ alkylphenyl groups, 1-naphthyl group and 2-naphthyl group.

The aryloxy group is exemplified by phenoxy group.

The heterocyclic aromatic compound group is exemplified by 2-thienyl group, 2-pyrrolyl group, 2-furyl group and 2-, 3- or 4-pyridyl group.

The polymeric fluorescent substance containing a formula (11) repeating unit and a formula (12) repeating unit contains said repeating units in a molar ratio of the formula (11) repeating unit and the formula (12) repeating unit, of preferably 1:1 to 1:10. The polymeric fluorescent substance containing repeating units of formula (11), formula (12) and formula (13) contains said repeating units in a molar ratio of the formula (11) repeating unit and the total of the other two repeating units, of preferably 1:1 to 1:10 and, in view of the solubility in solvents, contains the formula (12) repeating unit in an amount of preferably 30 mole % or more based on the total repeating units.

In order to obtain a high quantum yield of fluorescence, the polymeric fluorescent substances of the present invention must contain a repeating unit of formula (14), formula (15) or formula (11). By changing the ratio of the formula (14) repeating unit and the formula (16) repeating unit, or the ratio of the formula (15) repeating unit and the formula (16) repeating unit, or the ratio of the formula (8) repeating unit and the total of the repeating units of formula (14) and formula (15), the peak wavelength of fluorescence can be changed and accordingly a desired fluorescence can be selected; therefore, use of two or more repeating units is advantageous.

The repeating unit of formula (11) is exemplified by 1,3-phenylene group, 5-alkyl-1,3-phenylene groups, 5-alkoxy-1,3-phenylene groups, pyridine-2,6-diyl group and 1-alkylpyridine-2,6-diyl groups. Of these, 1,3-phenylene group and pyridine-2,6-diyl group are preferable.

The repeating unit of formula (12) is exemplified by 1,4-phenylene group, 2-alkyl-1,4-phenylene groups, 2-alkoxy-1,4-phenylene groups, 2-alkylthio-1,4-phenylene groups, 2-aryl-1,4-phenylene groups, 2-aryloxy-1,4-phenylene groups, 2,5-dialkyl-1,4-phenylene groups, 2,5-dialkoxy-1,4-phenylene groups, 2,5-dialkylthio-1,4-phenylene groups, 2,5-diaryl-1,4-phenylene groups, 2,5-diaryloxy-1,4-phenylene groups, 2,6-dialkyl-1,4-phenylene groups, 2,6-dialkoxy-1,4-phenylene groups, 2,6-dialkylthio-1,4-phenylene groups, 2,6-diaryl-1,4-phenylene groups and 2,6-diaryloxy-1,4-phenylene groups. Of these, preferable are 1,4-phenylene group, 2,5-dialkyl-1,4-phenylene groups, 2,5-dialkoxy-1,4-phenylene groups, 2,6-dialkyl-1,4-phenylene groups and 2,6-dialkoxy-1,4-phenylene groups.

When the formula (12) repeating unit is a substituted repeating unit, the substituent(s) of said repeating unit is (are) described. The alkyl group of 1–20 carbon atoms includes methyl group, ethyl group, propyl group, butyl group, pentyl group, hexyl group, heptyl group, octyl group, decyl group, lauryl group, etc. Of these, preferable are methyl group, ethyl group, pentyl group, hexyl group, heptyl group and octyl group.

The alkoxyl group of 1–20 carbon atoms includes methoxyl group, ethoxyl group, propoxyl group, butoxyl group, pentyloxy group, hexyloxy group, heptyloxy group, octyloxy group, decyloxy group, lauryloxy group, etc. Of these, preferable are methoxy group, ethoxy group, pentyloxy group, hexyloxy group, heptyloxy group and octyloxy group.

The alkylthio group includes methylthio group, ethylthio group, propylthio group, butylthio group, pentylthio group, hexylthio group, heptylthio group, octylthio group, decylthio group, laurylthio group, etc. Of these, preferable are methylthio group, ethylthio group, pentylthio group, hexylthio group, hepthylthio group and octylthio group.

The aryl group is exemplified by phenyl group, 4-$C_1$–$C_{12}$ alkoxyphenyl groups ($C_1$–$C_{12}$ refers to 1–12 carbon atoms), 4-$C_1$–$C_{12}$ alkylphenyl groups, 1-naphthyl group and 2-naphthyl group.

The aryloxy group is exemplified by phenoxy group.

The heterocyclic aromatic compound group is exemplified by 2-thienyl group, 2-pyrrolyl group, 2-furyl group and 2-, 3- or 4-pyridyl group.

The repeating unit of formula (13) is exemplified by 2-alkyl-1,4-phenylene groups, 2-alkoxy-1,4-phenylene groups, 2-alkylthio-1,4-phenylene group, 2-aryl-1,4-phenylene groups, 2-aryloxy-1,4-phenylene groups, 2,5-dialkyl-1,4-phenylene groups, 2,5-dialkoxy-1,4-phenylene groups, 2,5-dialkylthio-1,4-phenylene groups, 2,5-diaryl-1,4-phenylene groups, 2,5-diaryloxy-1,4-phenylene groups, 2,6-dialkyl-1,4-phenylene groups, 2,6-dialkoxy-1,4-phenylene groups, 2,6-dialkylthio-1,4-phenylene groups, 2,6-diaryl-1,4-phenylene groups and 2,6-diaryloxy-1,4-phenylene groups. Of these, preferable are 2,5-dialkyl-1,4-phenylene groups, 2,5-dialkoxy-1,4-phenylene groups, 2,6-dialkyl-1,4-phenylene groups and 2,6-dialkoxy-1,4-phenylene groups.

The polymeric fluorescent substances of the present invention are polymers containing the above-mentioned repeating units, are soluble in solvents and, when made into a thin film, show a high quantum yield of fluorescence.

The polymeric fluorescent substances of the present invention and the polymeric fluorescent substances used in the organic EL devices of the present invention may each be a random, block or graft copolymer, or a polymer having a structure intermediate between those of said copolymers, for example, a block-type random copolymer. A block-type random copolymer or a block or graft copolymer is preferred to a wholly random copolymer, in order to obtain a high quantum yield of fluorescence.

In the organic EL devices of the present invention, a luminescence emitted from a thin film is utilized. Therefore, the polymeric fluorescent substances used therein must emit a fluorescence in a solid state.

The polymeric fluorescent substances of the present invention and the polymeric fluorescent substances used in the organic EL devices of the present invention each have bent portions in the main chain and are not difficult to dissolve in solvents for film making. However, in order to obtain a polymer having higher solubility in solvents and better film-making property, it is preferable that each conjugated moiety of the main chain of the polymer has at least one aryl or heterocyclic aromatic compound group with its ring substituted with at least one substituent selected from the group consisting of alkyl, alkoxyl or alkylthio groups of 4–20 carbon atoms, aryl or aryloxy groups of 6–18 carbon atoms and heterocyclic aromatic compound groups of 4–14 carbon atoms.

The substituents are exemplified by the following. The alkyl group of 4–20 carbon atoms includes butyl group, pentyl group, hexyl group, heptyl group, octyl group, decyl group, lauryl group, etc. Of these, preferable are pentyl group, hexyl group, heptyl group and octyl group.

The alkoxyl group of 4–20 carbon atoms includes butoxyl group, pentyloxy group, hexyloxy group, heptyloxy group, octyloxy group, decyloxy group, lauryloxy group, etc. Of these, preferable are pentyloxy group, hexyloxy group, heptyloxy group and octyloxy group.

The alkylthio group includes butylthio group, pentylthio group, hexylthio group, heptylthio group, octylthio group, decylthio group, laurylthio group, etc. Of these, preferable are pentylthio group, hexylthio group, hepthylthio group and octylthio group.

The aryl group is exemplified by phenyl group, 4-$C_1$–$C_{12}$ alkoxyphenyl groups ($C_1$–$C_{12}$ refers to 1–12 carbon atoms), 4-$C_1$–$C_{12}$ alkylphenyl groups, 1-naphthyl group and 2-naphthyl group.

The aryloxy group is exemplified by phenoxy group.

The heterocyclic aromatic compound group is exemplified by 2-thienyl group, 2-pyrrolyl group, 2-furyl group and 2-, 3- or 4-pyridyl group.

The number of the substituents varies depending upon the molecular weight of the desired polymer and the constitution of the repeating units contained in the polymer. However, in order to obtain a copolymer of high solubility, the number of the substituents is preferably one or more per molecular weight of 600.

The good solvent for the polymeric fluorescent substances is exemplified by chloroform, methylene chloride, dichloroethane, tetrahydrofuran, toluene and xylene. Each polymeric fluorescent substance can be dissolved in each of these solvents in an amount of generally 0.1% by weight or more although the amount varies depending upon the structure and molecular weight of the polymer.

The polymerization degree of each polymeric fluorescent substance of the present invention or each polymeric fluorescent substance used in the organic EL devices of the present invention is not particularly restricted as long as the polymer has a polystyrene-reduced molecular weight of $10_3$–$10_7$, and varies depending upon the constitution and proportions of the repeating units contained in the polymer. In view of the film-forming property of the polymer, the appropriate polymerization degree is generally 4–10,000, preferably 5–3,000, more preferably 10–2,000 in terms of the total number of the repeating units.

Next are shown specific examples of the polymeric fluorescent substances of the present invention.

Firstly, polymers each containing a repeating unit represented by the following formula (21) are illustrated:

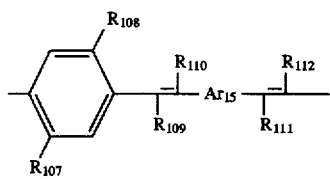

(21)

wherein $R_{107}$ and $R_{108}$ are selected from A0 to A59 (each is a combination of substituents) of Table 1; $R_{109}$ to $R_{112}$ are selected form B0 to B3 (each is a combination of substituents) of Table 2; and $Ar_{15}$ is selected from D0 to D8 (each is a substituent) of Table 3.

From A0 to A59, B0 to B3 and D0 to D8 are selected, respectively, An, Bm and Dl (n is a number of 0–59, m is a number of 0–3 and l is a number of 0–8); an expression of repeating unit E ((n×4+m)×9+l) is used to indicate the combination of An, Bm and Dl; thus, repeating units E0 to E2159 are obtained. As a result, there are obtained polymers each containing 5–1,000 units of one of E0 to E2159.

TABLE 1

| No. | $R_{107}$ | $R_{108}$ |
|---|---|---|
| A0 | $-H$ | $-C_5H_{11}$ |
| A1 | $-H$ | $-C_6H_{13}$ |
| A2 | $-H$ | $-C_7H_{15}$ |
| A3 | $-H$ | $-C_8H_{17}$ |
| A4 | $-H$ | $-C_{10}H_{21}$ |
| A5 | $-H$ | $-C_{12}H_{25}$ |
| A6 | $-H$ | $-C_{14}H_{29}$ |
| A7 | $-CH_3$ | $-C_5H_{11}$ |
| A8 | $-CH_3$ | $-C_6H_{13}$ |
| A9 | $-CH_3$ | $-C_7H_{15}$ |
| A10 | $-CH_3$ | $-C_8H_{17}$ |
| A11 | $-CH_3$ | $-C_{10}H_{21}$ |
| A12 | $-CH_3$ | $-C_{12}H_{25}$ |
| A13 | $-CH_3$ | $-C_{14}H_{29}$ |
| A14 | $-C_2H_5$ | $-C_5H_{11}$ |
| A15 | $-C_2H_5$ | $-C_6H_{13}$ |
| A16 | $-C_2H_5$ | $-C_7H_{15}$ |
| A17 | $-C_2H_5$ | $-C_8H_{17}$ |
| A18 | $-C_2H_5$ | $-C_{10}H_{21}$ |
| A19 | $-C_2H_5$ | $-C_{12}H_{25}$ |
| A20 | $-C_2H_5$ | $-C_{14}H_{29}$ |
| A21 | $-C_5H_{11}$ | $-C_5H_{11}$ |
| A22 | $-C_6H_{13}$ | $-C_6H_{13}$ |
| A23 | $-C_7H_{15}$ | $-C_7H_{15}$ |
| A24 | $-C_8H_{17}$ | $-C_8H_{17}$ |
| A25 | $-C_{10}H_{21}$ | $-C_{10}H_{21}$ |
| A26 | $-C_{12}H_{25}$ | $-C_{12}H_{25}$ |
| A27 | $-C_{14}H_{29}$ | $-C_{14}H_{29}$ |
| A28 | $-H$ | (phenyl) |
| A29 | (phenyl) | (phenyl) |
| A30 | $-H$ | $-OC_5H_{11}$ |
| A31 | $-H$ | $-OC_6H_{13}$ |
| A32 | $-H$ | $-OC_7H_{15}$ |
| A33 | $-H$ | $-OC_8H_{17}$ |
| A34 | $-H$ | $-OC_{10}H_{21}$ |
| A35 | $-H$ | $-OC_{12}H_{25}$ |
| A36 | $-H$ | $-OC_{14}H_{29}$ |
| A37 | $-OCH_3$ | $-OC_5H_{11}$ |
| A38 | $-OCH_3$ | $-OC_6H_{13}$ |
| A39 | $-OCH_3$ | $-OC_7H_{15}$ |
| A40 | $-OCH_3$ | $-OC_8H_{17}$ |
| A41 | $-OCH_3$ | $-OC_{10}H_{21}$ |
| A42 | $-OCH_3$ | $-OC_{12}H_{25}$ |
| A43 | $-OCH_3$ | $-OC_{14}H_{29}$ |
| A44 | $-OC_2H_5$ | $-OC_5H_{11}$ |
| A45 | $-OC_2H_5$ | $-OC_6H_{13}$ |
| A46 | $-OC_2H_5$ | $-OC_7H_{15}$ |
| A47 | $-OC_2H_5$ | $-OC_8H_{17}$ |
| A48 | $-OC_2H_5$ | $-OC_{10}H_{21}$ |
| A49 | $-OC_2H_5$ | $-OC_{12}H_{25}$ |
| A50 | $-OC_2H_5$ | $-OC_{14}H_{29}$ |
| A51 | $-OC_5H_{11}$ | $-OC_5H_{11}$ |
| A52 | $-OC_6H_{13}$ | $-OC_6J_{13}$ |
| A53 | $-OC_7H_{15}$ | $-OC_7H_{15}$ |
| A54 | $-OC_8H_{17}$ | $-OC_8H_{17}$ |
| A55 | $-OC_{10}H_{21}$ | $-OC_{10}H_{21}$ |
| A56 | $-OC_{12}H_{25}$ | $-OC_{12}H_{25}$ |
| A57 | $-OC_{14}H_{29}$ | $-OC_{14}H_{29}$ |

TABLE 1-continued

| No. | $R_{107}$ | $R_{108}$ |
|---|---|---|
| A58 | —H | —O—⟨phenyl⟩ |
| A59 | —O—⟨phenyl⟩ | —O—⟨phenyl⟩ |

TABLE 2

| No. | $R_{109}$ | $R_{110}$ | $R_{111}$ | $R_{112}$ |
|---|---|---|---|---|
| B0 | —H | —H | —H | —H |
| B1 | —H | —CN | —CN | —H |
| B2 | —H | —CH$_3$ | —CH$_3$ | —H |
| B3 | —H | ⟨phenyl⟩ | ⟨phenyl⟩ | —H |

TABLE 3

D0, D1, D2, D3, D4, D5, D6, D7, D8 (structural formulas shown)

Then, copolymers each containing the formula (21) repeating unit and a repeating unit of the following formula (22) are illustrated:

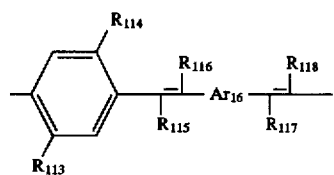

(22)

wherein $R_{113}$ and $R_{114}$ are selected from F0 to F59 (each is a combination of substituents) of Table 4; $R_{115}$ to $R_{118}$ are selected from G0 to G3 (each is a combination of substituents) of Table 5; and $Ar_{16}$ is selected from H0 to H13 (each is a substituent) of Table 6.

From F0 to F59, G0 to G3 and H0 to H13 are selected, respectively. Fp, Gq and Hr (p is a number of 0–59, q is a number of 0–3 and r is a number of 0–13); an expression of I ((p×4+q)×14+r) is used to indicate the combination of Fp, Gq and Hr; thus, repeating units I0 to I3119 are obtained. From E0 to E2159 (previously described) and I0 to I3119 are selected each one repeating unit, i.e. Es and It (s is 0–2159 and t is 0–3119). By copolymerizing Es and It, fluorescent copolymers J0 to J6739199 are obtained when the combination of Es and It is indicated as J (s×3120+t). The copolymers are random copolymers in which the ratio of the Es number and the It number is 1:0 to 1:24, or alternating copolymers composed of Es and It.

TABLE 4

| No. | $R_{113}$ | $R_{114}$ |
|---|---|---|
| F0 | —H | —C$_5$H$_{11}$ |
| F1 | —H | —C$_6$H$_{13}$ |
| F2 | —H | —C$_7$H$_{15}$ |
| F3 | —H | —C$_8$H$_{17}$ |
| F4 | —H | —C$_{10}$H$_{21}$ |
| F5 | —H | —C$_{12}$H$_{25}$ |
| F6 | —H | —C$_{14}$H$_{29}$ |
| F7 | —CH$_3$ | —C$_5$H$_{11}$ |
| F8 | —CH$_3$ | —C$_6$H$_{13}$ |
| F9 | —CH$_3$ | —C$_7$H$_{15}$ |

TABLE 4-continued

| No. | $R_{113}$ | $R_{114}$ |
|---|---|---|
| F10 | —CH$_3$ | —C$_8$H$_{17}$ |
| F11 | —CH$_3$ | —C$_{10}$H$_{21}$ |
| F12 | —CH$_3$ | —C$_{12}$H$_{25}$ |
| F13 | —CH$_3$ | —C$_{14}$H$_{29}$ |
| F14 | —C$_2$H$_5$ | —C$_5$H$_{11}$ |
| F15 | —C$_2$H$_5$ | —C$_6$H$_{13}$ |
| F16 | —C$_2$H$_5$ | —C$_7$H$_{15}$ |
| F17 | —C$_2$H$_5$ | —C$_8$H$_{17}$ |
| F18 | —C$_2$H$_5$ | —C$_{10}$H$_{21}$ |
| F19 | —C$_2$H$_5$ | —C$_{12}$H$_{25}$ |
| F20 | —C$_2$H$_5$ | —C$_{14}$H$_{29}$ |
| F21 | —C$_5$H$_{11}$ | —C$_5$H$_{11}$ |
| F22 | —C$_6$H$_{13}$ | —C$_6$H$_{13}$ |

TABLE 4-continued

| No. | $R_{113}$ | $R_{114}$ |
|---|---|---|
| F23 | $-C_7H_{15}$ | $-C_7H_{15}$ |
| F24 | $-C_8H_{17}$ | $-C_8H_{17}$ |
| F25 | $-C_{10}H_{21}$ | $-C_{10}H_{21}$ |
| F26 | $-C_{12}H_{25}$ | $-C_{12}H_{25}$ |
| F27 | $-C_{14}H_{29}$ | $-C_{14}H_{29}$ |
| F28 | $-H$ |  |
| F29 |  |  |
| F30 | $-H$ | $-OC_5H_{11}$ |
| F31 | $-H$ | $-OC_6H_{13}$ |
| F32 | $-H$ | $-OC_7H_{15}$ |
| F33 | $-H$ | $-OC_8H_{17}$ |
| F34 | $-H$ | $-OC_{10}H_{21}$ |
| F35 | $-H$ | $-OC_{12}H_{25}$ |
| F36 | $-H$ | $-OC_{14}H_{29}$ |
| F37 | $-OCH_3$ | $-OC_5H_{11}$ |
| F38 | $-OCH_3$ | $-OC_6H_{13}$ |
| F39 | $-OCH_3$ | $-OC_7H_{15}$ |
| F40 | $-OCH_3$ | $-OC_8H_{17}$ |
| F41 | $-OCH_3$ | $-OC_{10}H_{21}$ |
| F42 | $-OCH_3$ | $-OC_{12}H_{25}$ |
| F43 | $-OCH_3$ | $-OC_{14}H_{29}$ |
| F44 | $-OC_2H_5$ | $-OC_5H_{11}$ |
| F45 | $-OC_2H_5$ | $-OC_6H_{13}$ |
| F46 | $-OC_2H_5$ | $-OC_7H_{15}$ |
| F47 | $-OC_2H_5$ | $-OC_8H_{17}$ |
| F48 | $-OC_2H_5$ | $-OC_{10}H_{21}$ |
| F49 | $-OC_2H_5$ | $-OC_{12}H_{25}$ |

TABLE 4-continued

| No. | $R_{113}$ | $R_{114}$ |
|---|---|---|
| F50 | $-OC_2H_5$ | $-OC_{14}H_{29}$ |
| F51 | $-OC_5H_{11}$ | $-OC_5H_{11}$ |
| F52 | $-OC_6H_{13}$ | $-OC_6H_{13}$ |
| F53 | $-OC_7H_{15}$ | $-OC_7H_{15}$ |
| F54 | $-OC_8H_{17}$ | $-OC_8H_{17}$ |
| F55 | $-OC_{10}H_{21}$ | $-OC_{10}H_{21}$ |
| F56 | $-OC_{12}H_{25}$ | $-OC_{12}H_{25}$ |
| F57 | $-OC_{14}H_{29}$ | $-OC_{14}H_{29}$ |
| F58 | $-H$ | 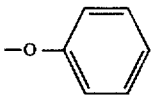 |
| F59 | 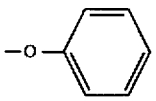 | 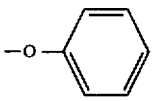 |

TABLE 5

| No. | $R_{115}$ | $R_{116}$ | $R_{117}$ | $R_{118}$ |
|---|---|---|---|---|
| G0 | $-H$ | $-CN$ | $-H$ | $-H$ |
| G1 | $-H$ | $-CN$ | $-CN$ | $-H$ |
| G2 | $-H$ | $-CH_3$ | $-CH_3$ | $-H$ |
| G3 | $-H$ |  |  | $-H$ |

TABLE 6

| H0 | H1 | H2 | H3 | H4 | H5 |
|---|---|---|---|---|---|
|  |  |  |  | 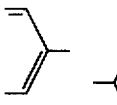 | 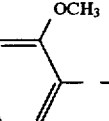 |

| H6 | H7 | H8 |
|---|---|---|
| 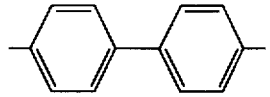 | 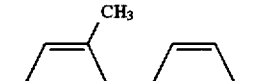 | 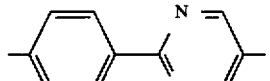 |

TABLE 6-continued

| H9 | H10 | H11 | H12 | H13 |
|---|---|---|---|---|
| 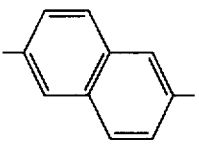 | 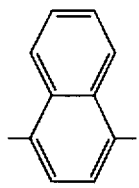 | 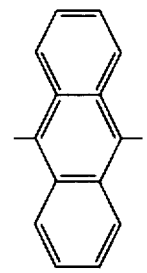 | 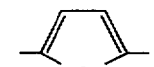 | 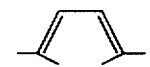 |

Use of the above-mentioned polymeric fluorescent substance in production of an organic EL device is very advantageous because the polymeric fluorescent substance is soluble in organic solvents and the resulting solution can be easily made into a thin film simply by coating and subsequent drying to remove the solvent. This simple operation can also be applied when a charge transport compound is added to the polymeric fluorescent substance.

The process for synthesis of the polymeric fluorescent substance used in the organic EL device of the present invention is not particularly restricted. However, as one process, there can be cited, for example, a Wittig reaction between a dialdehyde compound in which two aldehyde groups are attached to a repeating unit of formula (1) and a diphosphonium salt obtained from triphenylphosphine and a compound in which two halogenated methyl groups are attached to a repeating unit of formula (2).

In the reaction, the dialdehyde compound and the diphosphonium salt can bond directly to each other, but the two molecules of any one compound do not bond directly to each other. Therefore, by adding a dialdehyde compound in which two aldehyde groups are attached to a repeating unit of formula (2) to change the proportions of two dialdehyde compounds, the substantial length of conjugated chain in the polymeric fluorescent substance obtained can be controlled as desired.

As another process, there can be cited a dehydrohalogenation process which comprises subjecting to dehydrohalogenation a compound in which two halogenated methyl groups are attached to both ends of an aromatic oligomer containing a repeating unit of formula (1) and a compound in which two halogenated methyl groups are attached to a repeating unit of formula (2).

There can also be cited a sulfonium salt decomposition process which comprises alkali-polymerizing a compound which is a formula (1) repeating unit-containing aromatic oligomer having a sulfonium salt structure at both ends, to form an intermediate and heat-treating the intermediate to obtain a polymeric fluorescent substance.

Of these processes, the process using the Wittig reaction is preferable in view of the reaction control and yield.

With respect to the process for synthesis of a polymeric fluorescent substance having a cyanovinyl group, there is no particular restriction. However, there can be used, for example, a process similar to those described in J. Org. Chem., Vol. 25, p. 813 (1959); Makromol. Chem., Vol. 74, p. 71 (1964); etc.

For example, there can be cited a Knoevenagel reaction which comprises polymerizing a corresponding diacetonitrile (specifically, m-phenylenediacetonitrile, for example) and a corresponding dialdehyde compound (specifically, 2,5-dioctyloxyterephthalaldehyde, for example) in, for example, a mixed solvent of ethyl alcohol and chloroform in the presence of sodium methoxide. In order to obtain a copolymer, it is possible to react two or more diacetonitriles and/or two or more dialdehyde compounds.

Since each of the Wittig reaction and the Knoevenagel reaction can be conducted using lithium ethoxide or the like, a reaction using a dialdehyde compound(s), a diphosphonium compound(s) and a diacetonitrile compound(s) in appropriate amounts can produce a copolymer of all of these monomers.

More specific description is made on a process for synthesis of an arylene vinylene copolymer which is an example of the polymeric fluorescent substances used in the organic EL devices of the present invention.

When an arylene vinylene copolymer is for example obtained by a Wittig reaction, a bis(halogenated methyl) compound (e.g. 2,5-dioctyloxy-p-xylilene dibromide) is for example reacted with triphenylphosphine in N,N-dimethylformamide, a solvent, to synthesize a phosphonium salt, and this salt is subjected to condensation with a dialdehyde compound containing a formula (1) structure, for example, isophthalaldehyde in, for example, ethyl alcohol in the presence of lithium ethoxide to obtain an arylene vinylene copolymer having a 1,3-phenylene group. Addition, in this case, of a dialdehyde compound containing a formula (2) structure, specifically, terephthalaldehyde, can produce a copolymer having a longer conjugated chain. In order to obtain a copolymer, two or more diphosphonium salts and/or two or more dialdehyde compounds may be reacted.

When the thus-produced polymer is used as a light emitting material of an organic EL device, the purity of the polymer has an influence on the luminous property of the device. It is, therefore, desirable that the polymer after synthesis is subjected to purification treatments such as reprecipitation, chromatographic separation and the like.

Regarding the structure of the organic EL device produced by using the polymeric fluorescent substance of the present invention, no specific restrictions are imposed and a known structure can be employed as long as a light emitting material comprising said polymeric fluorescent substance is used in the light emitting layer provided between a pair of electrodes at least one of which is transparent or semitransparent.

Examples of said structure includes one in which a pair of electrodes are provided on both sides of the light emitting layer comprising the polymeric fluorescent substance or comprising a mixture of the polymeric fluorescent substance and a charge transport material, which is a generic name for electron transport material and hole transport material, and one in which an electron transport layer containing an electron transport material is laminated between a cathode and a light emitting layer in adjacency to the light emitting layer and/or in which a hole transport layer containing a hole transport material is laminated between an anode and a light emitting layer in adjacency to the light emitting layer.

The light emitting layer and the charge transport layer may each be provided as a single layer or as a combination of two or more layers, all of which embodiments are embraced in the scope of the present invention. Further, a light emitting material (or materials) other than the polymeric fluorescent substance, such as mentioned below, may be mixed in the light emitting layer. Also, the light emitting layer and/or charge transport layer may be formed by dispersing the polymeric fluorescent substance and/or charge transport material in a polymeric compound.

As for the charge transport material, i.e. electron transport material or hole transport material, used with a polymeric fluorescent substance of the present invention, such a material is not specified and known types can be used in the present invention. For example, as the hole transport material, there can be used pyrazoline derivatives, arylamine derivatives, stilbene derivatives, triphenyldiamine derivatives, etc. As the electron transport material, there can be used oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, metal complexes of 8-hydroxyquinoline and its derivatives, etc.

More concrete examples of these materials are shown in JP-A-63-70257, JP-A-63-175860, JP-A-2-135359, JP-A-2-135361, JP-A-2-209988, JP-A-3-37992 and JP-A-3-152184. As the hole transport material, triphenyldiamine derivatives are preferably used, and as the electron transport material, oxadiazole derivatives, benzoquinone and its derivatives, anthraquinone and its derivatives, and metal complexes of 8-hydroxyquinoline and its derivatives are preferably used. More specifically, 4,4'-bis(N-(3-methylphenyl)-N-phenylamino)-biphenyl is preferred as the hole transport material, and 2-(4-biphenylyl)-5-(4-t-butylphenyl)-1,3,4-oxadiazole, benzoquinone, anthraquinone and tris(8-quinolinol)aluminum are preferred as the electron transport material.

In the present invention, one of these electron transport and hole transport compounds may be used, or both of electron transport and hole transport compounds may be used together. Also, these compounds may be used either singly or as a mixture of two or more of them.

When a charge transport layer is provided between a light emitting layer and an electrode, it is formed by using the above-mentioned charge transport material(s).

When a charge transport material is mixed in the light emitting layer, the amount thereof used varies depending upon the type of the compound used and other factors, so that it is properly decided considering these factors within such an amount range as the film-forming property and the luminous property of the compound are not impaired. Usually, the charge transport material is used in an amount of 1 to 40% by weight, preferably 2–30% by weight based on the light emitting material.

The light emitting material usable with a polymeric fluorescent substance of the present invention is not specified; for example, there can be used naphthalene derivatives, anthracene and its derivatives, perylene and its derivatives, dyes such as polymethine dyes, xanthene dyes, coumarin dyes and cyanine dyes, metal complexes of 8-hydroxyquinoline and its derivatives, aromatic amines, tetraphenylcyclopentadiene and its derivatives, tetraphenylbutadiene and its derivatives. More specifically, known light emitting materials, for example, those mentioned in JP-A-57-51781 and JP-A-59-194393 can be used.

A typical process for producing an organic EL device using a polymeric fluorescent substance of the present invention is described below.

A pair of transparent or semi-transparent electrodes, consisting of an anode and a cathode, are provided on a transparent substrate made of glass, transparent plastic or the like.

As the anode material, a conducting metal oxide film, a semi-transparent thin metallic film or the like is used. Specifically, a film of indium-tin-oxide (ITO), tin oxide or the like, or a film of Au, Pt, Ag, Cu or the like is used. The film is formed by a known film forming technique such as vacuum deposition, sputtering, plating or the like.

On this anode is formed a light emitting layer containing, as a light emitting material, the above-mentioned polymeric fluorescent substance or said substance and a charge transport material. This light emitting layer can be formed by coating the light emitting material in the form of a melt, a solution or a solution of a mixture of the polymeric fluorescent substance and the charge transport material by a known coating method such as spin coating, casting, dipping, bar coating, roll coating or the like. Preferably, a film is formed by coating the above solution or solution of mixture by spin coating, casting, dipping, bar coating, roll coating or the like.

The thickness of the light emitting layer is 1 nm to 1 µm, preferably 2 to 500 nm. A thickness in the range of 5 to 100 nm is preferred for increasing current density to elevate luminous efficiency.

When a thin film is formed by said coating method, the film is preferably dried by heating at 30°–300° C., preferably 60°–200° C., under reduced pressure or in an inert atmosphere for removing the solvent.

When said light emitting layer is laminated on a charge transport layer, which is a generic name for hole transport layer and electron transport layer, it is preferable that a hole transport layer is formed on the anode before the light emitting layer is provided by the above coating method, and/or after the light emitting layer is provided, an electron transport layer is formed thereon.

The method for forming the charge transport layer is not specified in the present invention; for example, the charge transport layer may be formed by vacuum deposition of a charge transport material in a powdery form, or by coating a solution of said material by an appropriate coating method such as spin coating, casting, dipping, bar coating, roll coating or the like, or by mixing and dispersing a polymeric compound and a charge transport material in a molten state or a state of solution and then coating the suspension by a suitable coating method such as spin coating, casting, dipping, bar coating, roll coating or the like. The polymeric compound to be mixed is not specified, but it is preferably a polymer which does not impede charge transport to any significant degree. Also, a polymer which does not have strong visible light absorbance is preferably used.

A polymer having a charge-transporting property can be used in the charge transport layer without mixing with a low-molecular-weight charge transport material.

Examples of the polymeric compound having a charge-transporting property are poly(N-vinylcarbazole), polyaniline and its derivatives, polythiophene and its derivatives, poly(p-phenylene vinylene) and its derivatives, poly(2,5-thienylene vinylene) and its derivatives. Examples of the polymeric compound not having a charge-transporting property are polycarbonates, polyacrylates, polymethyl acrylate, polymethyl methacrylate, polystyrenes, polyvinyl chloride, and polysiloxanes. For forming the film, a coating method is preferably employed because of easy formation of the film.

ethyl alcohol, and dissolved in chloroform. To the solution was added ethanol for reprecipitation. The resulting precipitate was dried under reduced pressure to obtain 3.64 parts by weight of a polymer. This polymer is referred to as polymeric fluorescent substance 1. The repeating units of the polymeric fluorescent substance 1 and the molar ratio thereof which was calculated from the ratio of the amounts of the monomers fed, are shown below.

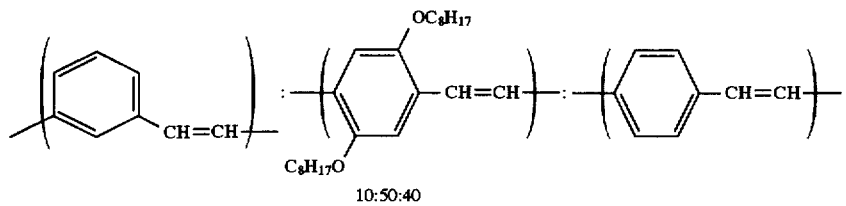

10:50:40

The thickness of the charge transport layer needs to be large enough to prevent formation of pinholes, but too large a thickness is undesirable because it increases device resistance, requiring a high drive voltage. In view of this, the recommended thickness of the charge transport layer is 1 nm to 1 μm, preferably 2 to 500 nm, more preferably 5 to 100 nm.

Then an electrode is provided on the light emitting layer or electron transport layer. This electrode serves as an electron injection cathode. The material thereof is not specified, but a material with small work function is preferred. There can be used, for example, Al, In, Mg, Ca, Li, Mg-Ag alloy, In-Ag alloy, Mg-In alloy, Mg-Al alloy, Mg-Li alloy, Al-Li alloy and graphite thin film. Vacuum deposition, sputtering or other suitable techniques may be used for forming the cathode.

The most remarkable feature of the polymeric fluorescent substances of the present invention in use as a light emitting material is that because of relatively high melting point and decomposition temperature, it is thermally stable, high in quantum yield of fluorescence and capable of forming a highly homogeneous light emitting layer with ease by a coating method, and it therefore allows very easy manufacture of high-luminance organic EL devices.

The present invention is hereinafter described in more detail by way of Examples. However, the present invention is not restricted to these Examples.

Herein, number-average molecular weight refers to a polystyrene-reduced number-average molecular weight as measured by gel permeation chromatography (GPC) using chloroform as a solvent.

EXAMPLE 1

Synthesis of Polymeric Fluorescent Substance 1

2,5-Dioctyloxy-p-xylylene dibromide was reacted with triphenylphosphine in N,N-dimethylformamide, a solvent, to synthesize a phosphonium salt. In ethyl alcohol were dissolved 9.56 parts by weight of the phosphonium salt, 0.268 part by weight of isophthalaldehyde and 1.07 parts by weight of terephthalaldehyde. To the resulting solution was dropwise added an ethyl alcohol solution containing 1.56 parts by weight of lithium ethoxide. The mixture was subjected to polymerization at room temperature for 3 hours and allowed to stand overnight at room temperature. The resulting precipitate was collected by filtration, washed with The polystyrene-reduced number-average molecular weight of the polymeric fluorescent substance 1 was 9.8× $10^3$. The measured elemental analysis values of the polymeric fluorescent substance 1 were 83.0% by weight carbon, 9.4% by weight hydrogen, less than 0.3% by weight nitrogen and less than 0.2% by weight chlorine and almost agreed with the calculated values. An NMR analysis confirmed that the observed hydrogen signals almost correspond to the structural formula obtained. Also, in the IR absorption spectrum of the polymeric fluorescent substance 1, the intake of isophthalaldehyde into said polymer was confirmed from the presence of an absorption peak due to m-substituted benzene.

Measurement of Absorption Spectrum and Fluorescence Spectrum and Evaluation of Quantum Yield of Fluorescence The polymeric fluorescent substance 1 could easily be dissolved in chloroform. A 0.05% chloroform solution of this polymeric fluorescent substance was spin-coated on a quartz plate to form a thin film of said polymer. The ultraviolet-visible light absorption spectrum and fluorescence spectrum of this thin film were measured by Spectrophotometer UV365 of Shimadzu Seisakusho K. K. and Fluorospectrophotometer 850 of Hitachi Ltd. The fluorescence spectrum of the film when excited at 410 nm was used for calculation of quantum yield of fluorescence. Intensity of fluorescence was obtained as a relative value determined by dividing the area of fluorescence spectrum plotted with abscissa used for wavenumber, by an absorbance at 410 nm. The fluorescence intensity, which is relative value of quantum yield of fluorescence, of the thin film of the polymeric fluorescent substance 1 was high as seen from Table 7.

Manufacture and Evaluation of EL Device

On a glass substrate having a 40-nm thick ITO film formed by sputtering was dip-coated a 1.0% by weight chloroform solution of the polymeric fluorescent substance 1 to form a 50-nm thick film on said substrate. The coating film was dried in vacuo at 80° C. for 1 hour. Thereon was vapor-deposited tris(8-quinolinol)-aluminum ($Alq_3$) at a rate of 0.1–0.2 nm/sec to form a 70-nm thick electron transport layer. Lastly, a magnesium-silver alloy (Mg:Ag=9:1 by weight) was vapor-deposited thereon as a cathode in a thickness of 150 nm to make an organic EL device. The degree of vacuum in vapor deposition was below $8 \times 10^{-6}$ Torr in all cases.

When a voltage of 10.5 V was applied to this device, a flow of electricity with a current density of 126 mA/cm$^2$ was induced and a yellowish green electroluminescence with a luminance of 1,037 cd/m$^2$ was observed. In this case, the luminous efficiency was 0.82 cd/A. The luminance was almost proportional to the current density. Increase in current density showed the highest luminance of 10,578 cd/m$^2$. The EL peak wavelength was 538 nm, which almost agreed with the peak wavelength of fluorescence of the thin film of polymeric fluorescent substance 1, whereby electroluminescence from the polymeric fluorescent substance 1 was confirmed.

EXAMPLE 2

Synthesis of Polymeric Fluorescent Substance 2

Synthesis, washing and reprecipitation were conducted in the same manner as in Example 1 except that there were used 0.671 part by weight of isophthalaldehyde and 0.671 part by weight of terephthalaldehyde, whereby 3.49 parts by weight of a polymer was obtained. The polymer is referred to as polymeric fluorescent substance 2. The repeating units of the polymeric fluorescent substance 2 and the molar ratio thereof which was calculated from the ratio of the amounts of the monomers fed, are shown below.

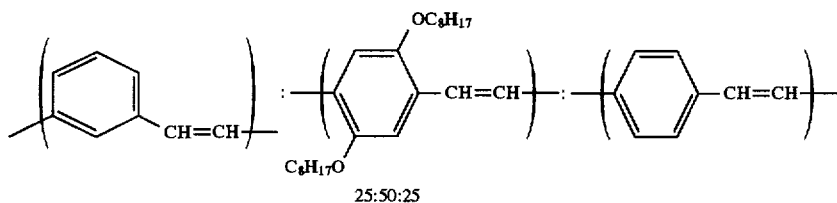

The polystyrene-reduced number-average molecular weight of the polymeric fluorescent substance 2 was 9.8× 10$^3$. The measured elemental analysis values of the polymeric fluorescent substance 2 were 83.0% by weight carbon, 9.4% by weight hydrogen, less than 0.3% by weight nitrogen and less than 0.2% by weight chlorine and almost agreed with the calculated values. An NMR analysis confirmed that the observed hydrogen signals almost correspond to the structural formula obtained. Also, in the IR absorption spectrum of the polymeric fluorescent substance 2, the intake of isophthalaldehyde into said polymer was confirmed from the presence of an absorption peak due to m-substituted benzene.

Measurement of Absorption Spectrum and Fluorescence Spectrum and Evaluation of Quantum Yield of Fluorescence The polymeric fluorescent substance 2 was measured for fluorescence intensity and peak wavelengths of absorption spectrum and fluorescence spectrum in the same manner as in Example 1. The fluorescence intensity of the thin film of the polymeric fluorescent substance 2 was high as seen from Table 7.

Manufacture and Evaluation of EL Device

An EL device was manufactured in the same manner as in Example 1 except that the polymeric fluorescent substance 2 was used in place of the polymeric fluorescent substance 1.

When a voltage of 12.3 V was applied to this device, a flow of electricity with a current density of 0.789 mA/cm$^2$ was induced and a green electroluminescence with a luminance of 14.4 cd/M$^2$ was observed. In this case, the luminous efficiency was 1.83 cd/A. The luminance was almost proportional to the current density. The EL peak wavelength was 530 nm, which almost agreed with the peak wavelength of fluorescence of the thin film of polymeric fluorescent substance 2, whereby electroluminescence from the polymeric fluorescent substance 2 was confirmed.

COMPARATIVE EXAMPLE 1

Synthesis of Polymeric Fluorescent Substance 3

2,5-Diheptyloxy-p-xylylene dibromide was reacted with triphenylphosphine in N,N-dimethylformamide, a solvent, to synthesize a phosphonium salt. In ethyl alcohol were dissolved 7.4 parts by weight of the phosphonium salt and 1 part by weight of terephthalaldehyde. To the solution was dropwise added an ethyl alcohol solution containing 0.9 part by weight of lithium ethoxide. The mixture was subjected to polymerization at room temperature for 3 hours and then allowed to stand overnight at room temperature. The resulting precipitate was collected by filtration, washed with ethyl alcohol and dissolved in chloroform. To the solution was added ethanol for reprecipitation. The resulting precipitate was dried under reduced pressure to obtain 1.5 parts by weight of a polymer. This polymer is referred to as polymeric fluorescent substance 3. The repeating units of the polymeric fluorescent substance 3 and the molar ratio thereof which was calculated from the ratio of the amounts of the monomers fed, are shown below.

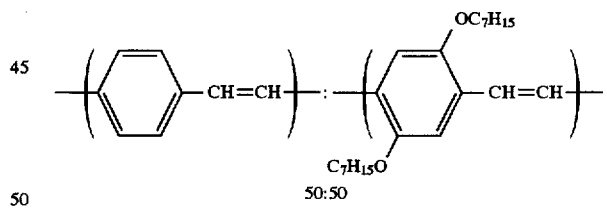

The polymeric fluorescent substance 3 was an alternating copolymer composed of these two repeating units.

The polystyrene-reduced number-average molecular weight of the polymeric fluorescent substance 3 was 1.0× 10$^4$. The measured elemental analysis values of the polymeric fluorescent substance 3 were 82.9% by weight carbon, 9.3% by weight hydrogen, less than 0.3% by weight nitrogen and less than 0.2% by weight bromine and almost agreed with the calculated values. An NMR analysis confirmed that the observed hydrogen signals almost correspond to the structural formula obtained.

Measurement of Absorption Spectrum and Fluorescence Spectrum and Evaluation of Quantum Yield of Fluorescence The polymeric fluorescent substance 3 was measured for fluorescence intensity and peak wavelengths of absorption spectrum and fluorescence spectrum in the same manner as in Example 1. The fluorescence intensity of the polymeric fluorescent substance 3 was lower than that of the polymeric fluorescent substance 1 of Example 1, as seen from Table 7.

Manufacture and Evaluation of EL Device

An EL device was manufactured in the same manner as in Example 1 except that the polymeric fluorescent substance 3 was used in place of the polymeric fluorescent substance 1.

When a voltage of 10.5 V was applied to this device, a flow of electricity with a current density of 20.5 mA/cm$^2$ was induced and a yellowish green electroluminescence with a luminance of 98.0 cd/m$^2$ was observed. In this case, the luminous efficiency was 0.48 cd/A. The luminance was almost proportional to the current density. Increase in current density showed the highest luminance of 2,770 cd/m$^2$. The EL peak wavelength was about 550 nm, which almost agreed with the peak wavelength of fluorescence of the thin film of polymeric fluorescent substance 3, whereby electroluminescence from the polymeric fluorescent substance 3 was confirmed.

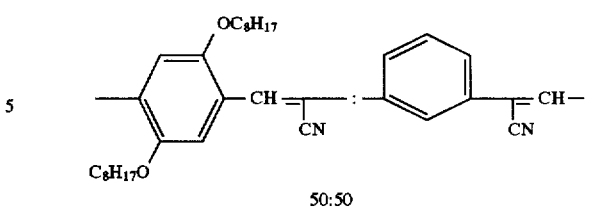

50:50

The polymeric fluorescent substance 4 was an alternating copolymer composed of these two repeating units.

The polystyrene-reduced number-average molecular weight of the polymeric fluorescent substance 4 was 5×10$^3$. The structure of the polymeric fluorescent substance 4 was confirmed from the IR absorption spectrum and $^1$H-NMR.

Measurement of Absorption Spectrum and Fluorescence Spectrum and Evaluation of Quantum Yield of Fluorescence The polymeric fluorescent substance 4 was measured for fluorescence intensity and peak wavelengths of absorption spectrum and fluorescence spectrum, in the same manner as

TABLE 7

| | EL properties | | | | | |
|---|---|---|---|---|---|---|
| | Voltage (v) | Current density (mA/cm$^2$) | Luminance (cd/m$^2$) | Luminous efficiency (cd/A) | EL peak wavelength (nm) | Quantum yield of fluorescence (arbitrary unit) |
| Example 1 | 10.5 | 126 | 1037 | 0.82 | 538 | 9.2 |
| Example 2 | 12.3 | 0.789 | 14.4 | 1.83 | 530 | 20.9 |
| Comparative Example 1 | 10.5 | 20.5 | 98.0 | 0.48 | 550 | 7.5 |

Thus, the organic EL devices manufactured using the polymeric fluorescent substance 1 of Example 1 or the polymeric fluorescent substance 2 of Example 2 had distinctly higher luminous efficiencies than that of the organic EL device of Comparative Example 1 and showed excellent EL properties.

EXAMPLE 3

Synthesis of Polymeric Fluorescent Substance 4

In a mixed solvent consisting of 100 parts by weight of ethyl alcohol and 100 parts by weight of chloroform were dissolved 1.95 parts by weight of 2,5-dioctyloxyterephthalaldehyde and 0.78 part by weight of m-phenylene diacetonitrile. Thereto was added 0.3 part by weight of a methanol solution containing 28% by weight of sodium methoxide. The mixture was stirred at room temperature for 6 hours. Thereto was added 200 parts by weight of ethyl alcohol. The mixture was allowed to stand overnight at room temperature. The resulting precipitate was collected by filtration, washed with ethyl alcohol, an ethyl alcohol/water mixed solvent and again ethyl alcohol in this order, and dried under reduced pressure to obtain 0.5 part by weight of a polymer. This polymer is referred to as polymeric fluorescent substance 4. The repeating units of the polymeric fluorescent substance 4 and the molar ratio thereof which was calculated from the ratio of the amounts of the monomers fed, is shown below.

in Example 1. The fluorescence intensity of the thin film of the polymeric fluorescent substance 4 was high as seen from Table 8.

COMPARATIVE EXAMPLE 2

Synthesis of Polymeric Fluorescent Substance 5

In a mixed solvent consisting of 100 parts by weight of ethyl alcohol and 100 parts by weight of chloroform were dissolved 1.95 parts by weight of 2,5-dioctyloxyterephthalaldehyde and 0.78 part by weight of p-phenylene diacetonitrile. Thereto was added 0.3 part by weight of a methanol solution containing 28% by weight of sodium methoxide. The mixture was stirred at room temperature for 6 hours. Thereto was added 200 parts by weight of ethyl alcohol. The mixture was allowed to stand overnight at room temperature. The resulting precipitate was collected by filtration, washed with ethyl alcohol, an ethyl alcohol/water mixed solvent and again ethyl alcohol in this order, and dried under reduced pressure to obtain 0.5 part by weight of a polymer. This polymer is referred to as polymeric fluorescent substance 5. The repeating units of the polymeric fluorescent substance 5 and the molar ratio thereof which was calculated from the ratio of the amounts of the monomers fed, is shown below.

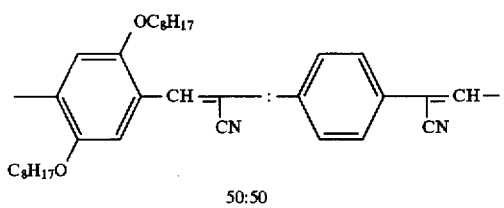

50:50

The polymeric fluorescent substance 5 was an alternating copolymer composed of these two repeating units.

The polystyrene-reduced number-average molecular weight of the polymeric fluorescent substance 5 was $7\times10^3$. The structure of the polymeric fluorescent substance 5 was confirmed from the IR absorption spectrum and $^1$H-NMR.

Measurement of Absorption Spectrum and
Fluorescence Spectrum and Evaluation of Quantum
Yield of Fluorescence The polymeric fluorescent substance 5 was measured for fluorescence intensity and peak wavelengths of absorption spectrum and fluorescence spectrum, in the same manner as in Example 1. The fluorescence intensity of the thin film of the polymeric fluorescent substance 5 was low as seen from Table 8.

TABLE 8

| | Peak wavelength of fluorescence (nm) | Quantum yield fluorescence (arbitrary unit) |
|---|---|---|
| Example 3 | 570 | 13.8 |
| Comparative Example 2 | 640 | 3.3 |

Thus, the polymeric fluorescent substance 4 of Example 3 had a higher quantum yield of fluorescence in a thin film state than the polymeric fluorescent substance 5 of Comparative Example 2 and showed excellent luminescence property.

EXAMPLE 4

Synthesis of Polymeric Fluorescent Substance 6

Synthesis, washing and reprecipitation were conducted in the same manner as in Example 1 except that 1.34 parts by weight of isophthalaldehyde was used as a dialdehyde compound, whereby a 3.02 parts by weight of a polymer was obtained. This polymer is referred to as polymeric fluorescent substance 6. The repeating units of the polymeric fluorescent substance 6 and the molar ratio thereof, which was calculated from the ratio of the amounts of the monomers fed, are shown below.

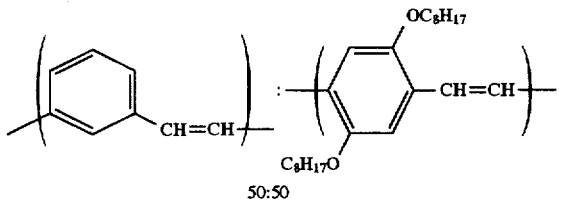

50:50

The polymeric fluorescent substance 6 was an alternating copolymer composed of these two repeating units.

The polystyrene-reduced number-average molecular weight of the polymeric fluorescent substance 6 was $7.3\times 10^3$. The measured elemental analysis values of the polymeric fluorescent substance 6 were 83.1% by weight carbon, 9.4% by weight hydrogen, less than 0.3% by weight nitrogen and less than 0.2% by weight chlorine and almost agreed with the calculated values. An NMR analysis confirmed that the observed hydrogen signals almost correspond to the structural formula obtained. Also, in the IR absorption spectrum of the polymeric fluorescent substance 6, the intake of isophthalaldehyde into said polymer was confirmed from the presence of an absorption peak due to m-substituted benzene.

Measurement of Absorption Spectrum and
Fluorescence Spectrum and Evaluation of Quantum
Yield of Fluorescence The polymeric fluorescent substance 6 was measured for fluorescence intensity and peak wavelengths of absorption spectrum and fluorescence spectrum, in the same manner as in Example 1. The fluorescence intensity of the thin film of the polymeric fluorescent substance 6 was high as seen from Table 9.

EXAMPLE 5

Synthesis of Polymeric Fluorescent Substance 7

Synthesis, washing and reprecipitation were conducted in the same manner as in Example 1 except that there were used, as a phosphonium compound, 8.50 parts by weight of a phosphonium compound obtained by reacting 2,5-dioctyloxy-1,4-xylylene dibromide with triphenylphosphine in N,N-dimethylformamide, a solvent, and as a dialdehyde compound, 1.10 parts by weight of pyridine-2,6-dialdehyde, whereby 0.50 part by weight of a polymer was obtained. The polymer is referred to as polymeric fluorescent substance 7. The repeating units of the polymeric fluorescent substance 7 and the molar ratio thereof, which was calculated from the ratio of the amounts of the monomers fed, are shown below.

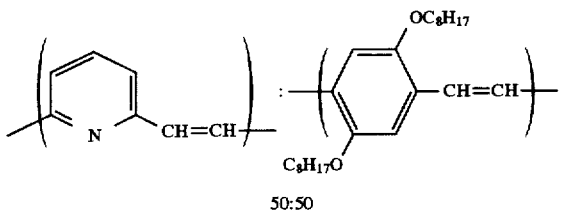

50:50

The polymeric fluorescent substance 7 was an alternating copolymer composed of these two repeating units.

The polystyrene-reduced number-average molecular weight of the polymeric fluorescent substance 7 was $1.3\times 10^4$. The measured elemental analysis values of the polymeric fluorescent substance 7 were 80.3% by weight carbon, 9.3% by weight hydrogen, 3.1% by weight nitrogen and less than 0.2% by weight bromine and almost agreed with the calculated values. The presence of nitrogen atom confirmed the intake of pyridine-2,6-dialdehyde into the polymer. An NMR analysis confirmed that the observed hydrogen signals almost correspond to the structural formula obtained.

Measurement of Absorption Spectrum and
Fluorescence Spectrum and Evaluation of Quantum
Yield of Fluorescence The polymeric fluorescent substance 7 was measured for fluorescence intensity and peak wavelengths of absorption spectrum and fluorescence spectrum, in the same manner as in Example 1. The fluorescence intensity of the thin film of the polymeric fluorescent substance 7 was high as seen from Table 9.

COMPARATIVE EXAMPLE 3

Synthesis of Polymeric Fluorescent Substance 8

Synthesis, washing and reprecipitation were conducted in the same manner as in Example 1 except that there were used, as a phosphonium compound, 7.67 parts by weight of a phosphonium compound obtained by reacting 2,5-dimethoxy-1,4-xylylene dichloride with triphenylphosphine in N,N-dimethylformamide, a solvent, and as a dialdehyde compound, 1.34 parts by weight of isophthalaldehyde, whereby 1.00 part by weight of a polymer was obtained. The polymer is referred to as polymeric fluorescent substance 8. The repeating units of the polymeric fluorescent substance 8 and the molar ratio thereof which was calculated from the ratio of the amounts of the monomers fed, are shown below.

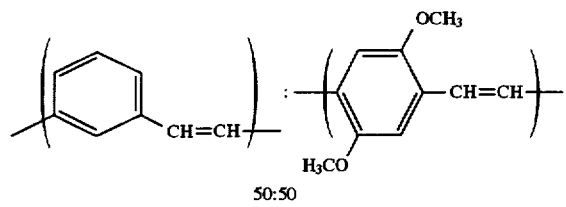

50:50

The polymeric fluorecent substance 8 was an alternating copolymer composed of these two repeating units.

The polystyrene-reduced number-average molecular weight of the polymeric fluorescent substance 8 was 2.9× $10^3$. The measured elemental analysis values of the polymeric fluorescent substance 8 were 78.4% by weight carbon, 5.8% by weight hydrogen, less than 0.3% by weight nitrogen and 1.9% by weight chlorine and almost agreed with the calculated values of a polymer having terminals assumed from the relatively low molecular weight obtained. An NMR analysis confirmed that the observed hydrogen signals almost correspond to the structural formula obtained.

Measurement of Absorption Spectrum and Fluorescence Spectrum and Evaluation of Quantum Yield of Fluorescence The polymeric fluorescent substance 8 was measured for fluorescence intensity and peak wavelengths of absorption spectrum and fluorescence spectrum, in the same manner as in Example 1. The fluorescence intensity of the thin film of the polymeric fluorescent substance 8 was low as seen from Table 9.

COMPARATIVE EXAMPLE 4

Synthesis of Polymeric Fluorescent Substance 9

Synthesis, washing and reprecipitation were conducted in the same manner as in Example 1 except that there were used, as a phosphonium compound, 8.45 parts by weight of a phosphonium compound obtained by reacting 2,5-diethyl-1,4-xylylene dibromide with triphenylphosphine in N,N-dimethylformamide, a solvent, and as a dialdehyde compound, 1.34 parts by weight of isophthalaldehyde, whereby 1.00 part by weight of a polymer was obtained. The polymer is referred to as polymeric fluorescent substance 9. The repeating units of the polymeric fluorescent substance 9 and the molar ratio thereof which was calculated from the ratio of the amounts of the monomers fed, are shown below.

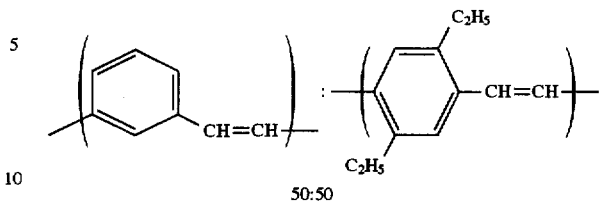

50:50

The polymeric fluorescent substance 9 was an alternating copolymer composed of these two repeating units.

The polystyrene-reduced number-average molecular weight of the polymeric fluorescent substance 9 was 4.8× $10^3$. The measured elemental analysis values of the polymeric fluorescent substance 9 were 90.8% by weight carbon, 7.4% by weight hydrogen, less than 0.3% by weight nitrogen and 0.2% by weight bromine and almost agreed with the calculated values. An NMR analysis confirmed that the observed hydrogen signals almost correspond to the structural formula obtained.

Measurement of Absorption Spectrum and Fluorescence Spectrum and Evaluation of Quantum Yield of Fluorescence The polymeric fluorescent substance 9 was measured for fluorescence intensity and peak wavelengths of absorption spectrum and fluorescence spectrum, in the same manner as in Example 1. The fluorescence intensity of the polymeric fluorescent substance 9 was low as seen from Table 9.

From the ratio of an absorption by benzene ring in the vicinity of 1,510 cm$^{-1}$ and an absorption by m-substituted benzene in the vicinity of 690 cm$^{-1}$ in the IR absorption spectrum, it was appreciated that the ratio of isophthalaldehyde and terephthalaldehyde both taken into each of the polymeric fluorescent substances 1, 2, 3 and 6 was almost identical to the ratio of said aldehydes fed.

TABLE 9

| | Peak wavelength of fluorescence (nm) | Quantum yield of fluorescence (arbitrary unit) |
|---|---|---|
| Example 1 | 538 | 9.2 |
| Example 2 | 530 | 20.9 |
| Example 4 | 504 | 42.7 |
| Example 5 | 572 | 8.1 |
| Comparative Example 1 | 550 | 7.5 |
| Comparative Example 3 | 476 | 4.9 |
| Comparative Example 4 | 450 | 1.9 |

Thus, the polymeric fluorescent substances 1, 2, 6 and 7 of Examples 1, 2, 4 and 5, respectively, each had a higher quantum yield of fluorescence in a thin film state than the polymeric fluorescent substance 3 of Comparative Example 1 having no m-substituted repeating unit and the polymeric fluorescent substances 8 and 9 of Comparative Examples 3 and 4, respectively, having only a substituent of 1–2 carbon atoms, and each showed excellent luminescence property.

What is claimed is:

1. An organic electroluminescence device having at least a light emitting layer between electrodes consisting of one pair of an anode and a cathode, at least one of which electrodes is transparent or semi-transparent, wherein said light emitting layer comprises a polymeric fluorescent substance which emits a fluorescence in a solid state, is soluble in solvents and is a copolymer comprising at least one kind of repeating unit represented by the following formula (1) and at least one kind of repeating unit represented by the following formula (2) with the number of the formula (1) repeating units being 2–50% of the total number of all the repeating units:

$$—Ar_1— \quad (1)$$

wherein $Ar_1$ is a bifunctional group forming a carbon—carbon bond with each of two adjacent groups and is selected from the group consisting of an aromatic compound group having 6–22 carbon atoms taking part in the conjugated bonds, an at least 6-membered heterocyclic aromatic compound group having at least one hetero atom and 4–20 carbon atoms, and an arylene vinylene group composed of said aromatic compound group or said heterocyclic aromatic compound group and a vinylene group; in the chemical structure of $Ar_1$, the number of the consecutive atoms present in the shortest path between the two carbon atoms bonding to said two adjacent groups is 1, 3 or 5, and $$—Ar_2— \quad (2)$$

wherein $Ar_2$ is a bifunctional group forming a carbon—carbon bond with each of two adjacent groups and is selected from the group consisting of an aromatic compound group having 6–22 carbon atoms taking part in the conjugated bonds, an at least 5-membered heterocyclic aromatic compound group having at least one hetero atom and 4–20 carbon atoms, and an arylene vinylene group composed of said aromatic compound group or said heterocyclic aromatic compound group and a vinylene group; in the chemical structure of $Ar_2$, the total number of the carbon and any nitrogen atoms present in the shortest path between the two carbon atoms bonding to said two adjacent groups is an even number, and at least one of $Ar_1$, and $Ar_2$ has at least one substituent selected from the group consisting of an alkyl, alkoxyl or alkylthio group of 4–20 carbon atoms, an aryl or aryloxy group of 6–18 carbon atoms and a heterocyclic aromatic compound group of 4–14 carbon atoms.

2. An organic electroluminescence device according to claim 1, wherein the repeating unit of formula (1) and the repeating unit of formula (2), both contained in the solvent-soluble polymeric fluorescent substance are respectively a repeating unit of the following formula (3) and a repeating unit of the following formula (4), respectively:

$$—Ar_3—CR_1=CR_2— \quad (3)$$

$$—Ar_4—CR_3=CR_4— \quad (4)$$

wherein $Ar_3$ is a bifunctional group forming a carbon—carbon bond with an adjacent vinylene group and a carbon—carbon bond with a vinylene group in an adjacent repeating unit and $Ar_3$ is selected from the group consisting of an aromatic compound group having 6–20 carbon atoms taking part in the conjugated bonds and an at least 6-membered heterocyclic aromatic compound group having at least one hetero atom and 4–18 carbon atoms; in the chemical structure of $Ar_3$, the number of the consecutive atoms present in the shortest path between the two carbon atoms bonding to said two adjacent vinylene groups is 1 or 3; wherein $Ar_4$ is a bifunctional group forming a carbon—carbon bond with an adjacent vinylene group and a carbon—carbon bond with a vinylene group in an adjacent repeating unit and $Ar_4$ is selected from an aromatic compound group having 6–20 carbon atoms taking part in the conjugated bonds and an at least 5-membered heterocyclic aromatic compound group having at least one hetero atom and 4–18 carbon atoms; in the chemical structure of $Ar_4$, the total number of the carbon and any nitrogen atoms present in the shortest path between the two carbon atoms bonding to said two adjacent vinylene groups is an even number; and $R_1$, $R_2$, $R_3$ and $R_4$ are independently selected from the group consisting of a hydrogen atom, a cyano group, an alkyl group of 1–20 carbon atoms and an aryl group of 6–18 carbon atoms.

3. An organic electroluminescence device according to claim 2, wherein the polymeric fluorescent substance is a polymeric fluorescent substance comprising at least one repeating unit selected from the repeating units represented by the following formula (8):

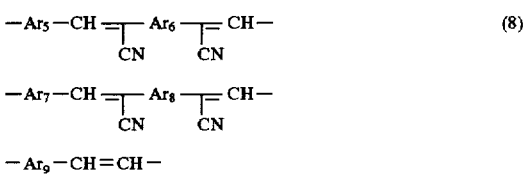

$$—Ar_9—CH=CH—$$

wherein $Ar_5$ and $Ar_9$ are each a bifunctional group forming a carbon—carbon bond with an adjacent vinylene group and a carbon—carbon bond with a vinylene group in an adjacent repeating unit, $Ar_8$ is a bifunctional group forming a carbon—carbon bond with each of the adjacent vinylene groups and $Ar_5$, $Ar_8$ and $Ar_9$ are independently selected from the group consisting of an aromatic compound group having 6–20 carbon atoms taking part in the conjugated bonds and an at least 5-membered heterocyclic aromatic compound group having at least one hetero atom and 4–18 carbon atoms; in the chemical structure of each of $Ar_5$, $Ar_8$ and $Ar_9$, the total number of carbon and nitrogen atoms, if any, present in the shortest path between the two carbon atoms bonding to said adjacent vinylene groups is an even number; $Ar_6$ is a bifunctional group forming a carbon—carbon bond with each of the adjacent vinylene groups, $Ar_7$ is a bifunctional group forming a carbon—carbon bond with an adjacent vinylene group and a carbon—carbon bond with a vinylene group in an adjacent repeating unit and $Ar_6$ and $Ar_7$ are independently selected from the group consisting of an aromatic compound group having 6–20 carbon atoms taking part in the conjugated bonds and an at least 6-membered heterocyclic aromatic compound group having at least one hetero atom and 4–18 carbon atoms; in the chemical structure of each of $Ar_6$ and $Ar_7$, the number of the consecutive atoms present in the shortest path between the two carbon atoms bonding to said adjacent vinylene groups is 1 or 3.

4. An organic electroluminescence device according to claim 1 or 2, wherein the repeating unit of formula (1) or the $Ar_3$ portion of formula (3) is selected from repeating units each containing at least one of the structures represented by the following formula (5):

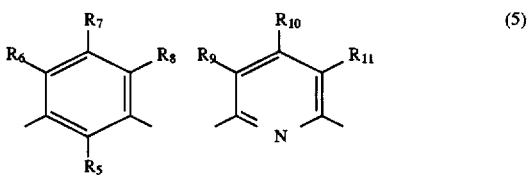

-continued

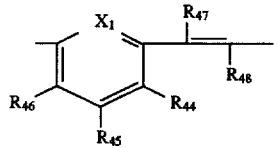

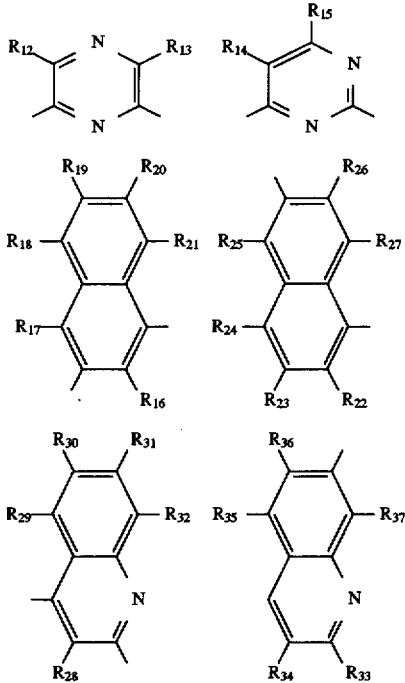

wherein $R_5$ to $R_{37}$ are independently selected from the group consisting of a hydrogen atom, a cyano group, an alkyl, alkoxy or alkylthio group of 1–20 carbon atoms, an aryl or aryloxy group of 6–18 carbon atoms and a heterocyclic aromatic compound group of 4–14 carbon atoms.

5. An organic electroluminescence device according to claim 4, wherein the polymeric fluorescent substance is a copolymer comprising repeating units represented by the following formulae (6) and (7):

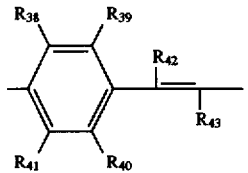

(6)

(7)

wherein $X_1$ is a group selected from the group consisting of C—$R_{49}$ and N; $R_{38}$ to $R_{41}$, $R_{44}$ to $R_{46}$ and $R_{49}$ are independently a group selected from the group consisting of a hydrogen atom, a cyano group, an alkyl, alkoxy or alkylthio group of 1–20 carbon atoms, an aryl or aryloxy group of 6–18 carbon atoms and a heterocyclic compound group of 4–14 carbon atoms; $R_{42}$, $R_{43}$, $R_{47}$ and $R_{48}$ are independently a group selected from the group consisting of a hydrogen atom, a cyano group, an alkyl group of 1–20 carbon atoms and an aryl group of 6–18 carbon atoms; and at least one of $R_{38}$ to $R_{49}$ is selected from the group consisting of an alkyl, alkoxyl or alkylthio group of 4–20 carbon atoms, an aryl or aryloxy group of 6–18 carbon atoms and a heterocyclic aromatic compound group of 4–14 carbon atoms.

6. An organic electroluminescence device according to claim 1, wherein a layer comprising an electron transport compound is provided between the cathode and the light emitting layer in adjacency to the light emitting layer.

7. An organic electroluminescence device according to claim 1, wherein a layer comprising a hole transport compound is provided between the anode and the light emitting layer in adjacency to the light emitting layer.

8. An organic electroluminescence device according to claim 1, wherein a layer comprising an electron transport compound is provided between the cathode and the light emitting layer in adjacency to the light emitting layer and a layer comprising a hole transport compound is provided between the anode and the light emitting layer in adjacency to the light emitting layer.

* * * * *